United States Patent
Ho

(10) Patent No.: US 12,400,854 B2
(45) Date of Patent: Aug. 26, 2025

(54) METHODS FOR MANUFACTURING TRANSISTORS

(71) Applicant: Taiwan Semiconductor Manufacturing Company, Hsinchu (TW)

(72) Inventor: Po-Hsun Ho, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 538 days.

(21) Appl. No.: 17/745,371

(22) Filed: May 16, 2022

(65) Prior Publication Data
US 2023/0369042 A1    Nov. 16, 2023

(51) Int. Cl.
| | |
|---|---|
| H01L 21/02 | (2006.01) |
| H10D 30/01 | (2025.01) |
| H10D 30/43 | (2025.01) |
| H10D 30/67 | (2025.01) |
| H10D 62/10 | (2025.01) |
| H10D 64/01 | (2025.01) |
| H10D 64/68 | (2025.01) |

(52) U.S. Cl.
CPC ..... *H01L 21/02175* (2013.01); *H10D 30/014* (2025.01); *H10D 30/43* (2025.01); *H10D 30/6735* (2025.01); *H10D 30/675* (2025.01); *H10D 30/6757* (2025.01); *H10D 62/121* (2025.01); *H10D 64/01* (2025.01); *H10D 64/693* (2025.01)

(58) Field of Classification Search
None
See application file for complete search history.

(56) References Cited

U.S. PATENT DOCUMENTS

| | | | |
|---|---|---|---|
| 2013/0049219 A1* | 2/2013 | Tsai | H01L 21/02063 257/774 |
| 2014/0239256 A1* | 8/2014 | Kim | H01L 21/02491 257/29 |
| 2017/0040418 A1* | 2/2017 | Chen | H01L 23/5283 |
| 2020/0373409 A1* | 11/2020 | Chen | H01L 21/02658 |

OTHER PUBLICATIONS

Tse-An Chen, Chih-Piao Chuu et al., Wafer-scale single-crystal hexagonal boron nitride monolayers on Cu (111), Nature.com, published Mar. 4, 2020, online.
Wei Liu et al, Role of Metal Contacts in Designing High-Performance Monolayer n-Type WSe2 Field Effect Transistors, NanoLetters, Published Mar. 25, 2013, online.

\* cited by examiner

*Primary Examiner* — Sue A Purvis
*Assistant Examiner* — Jordan M Klein
(74) *Attorney, Agent, or Firm* — Lippes Mathias LLP

(57) ABSTRACT

Methods for making transistors with a semiconducting monolayer are disclosed. The semiconducting monolayer is covered with a hexagonal boron nitride (hBN) monolayer. A thin gate dielectric layer can then be formed upon the hBN monolayer using a plasma-enhanced deposition process, without the semiconducting monolayer being damaged by the plasma. The resulting structure maintains high mobility in the semiconducting layer, has improved capacitance, and good heat dissipation.

20 Claims, 44 Drawing Sheets

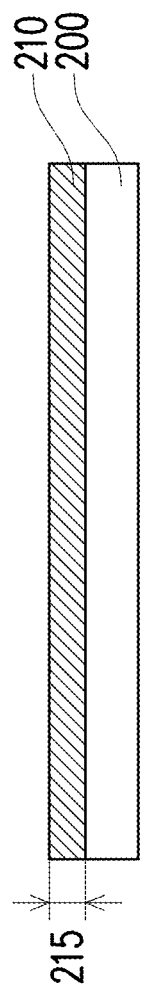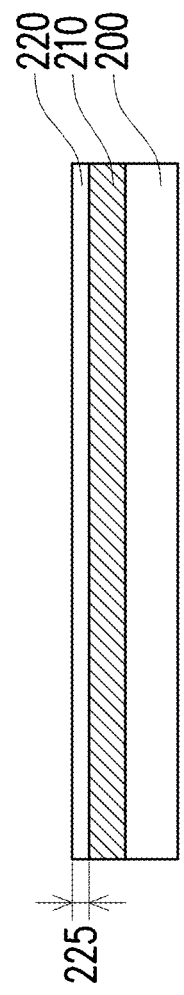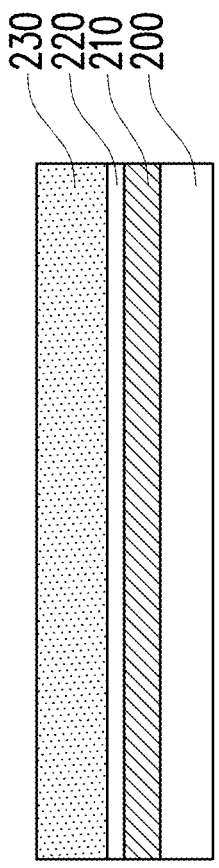

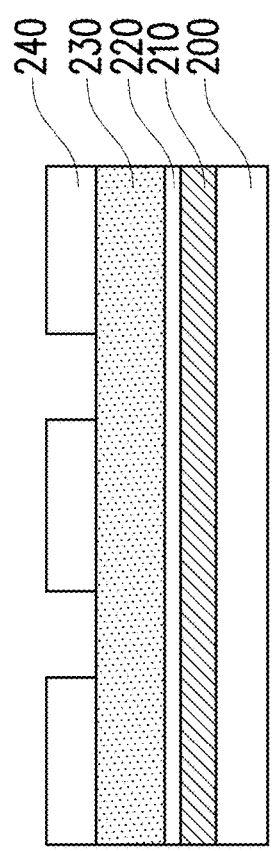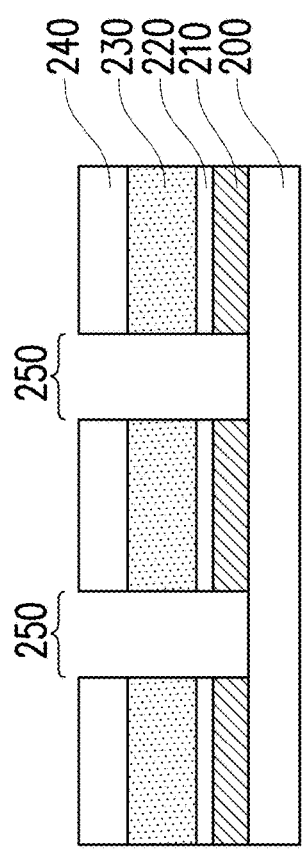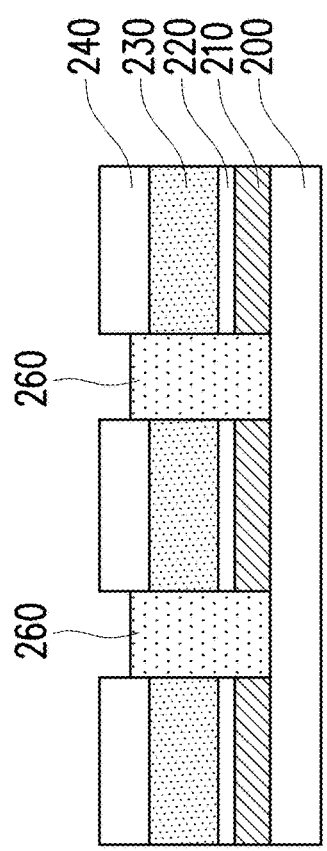

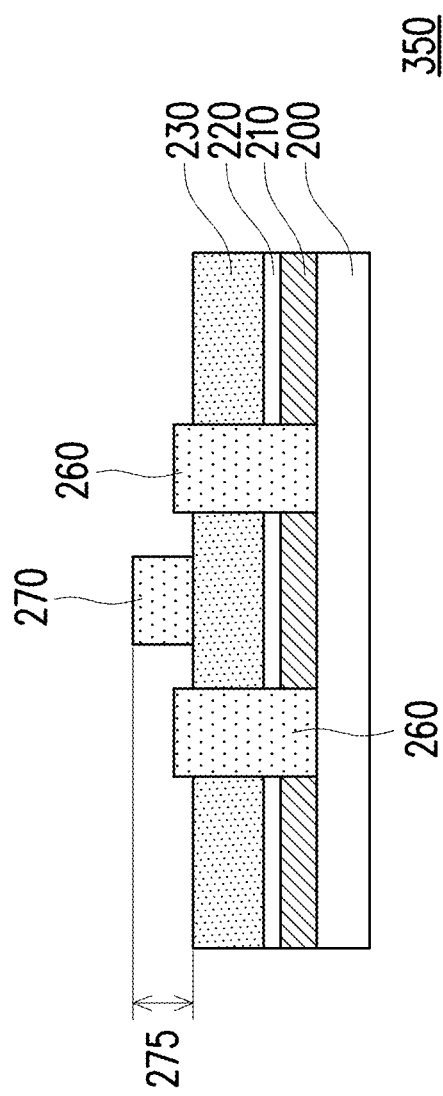
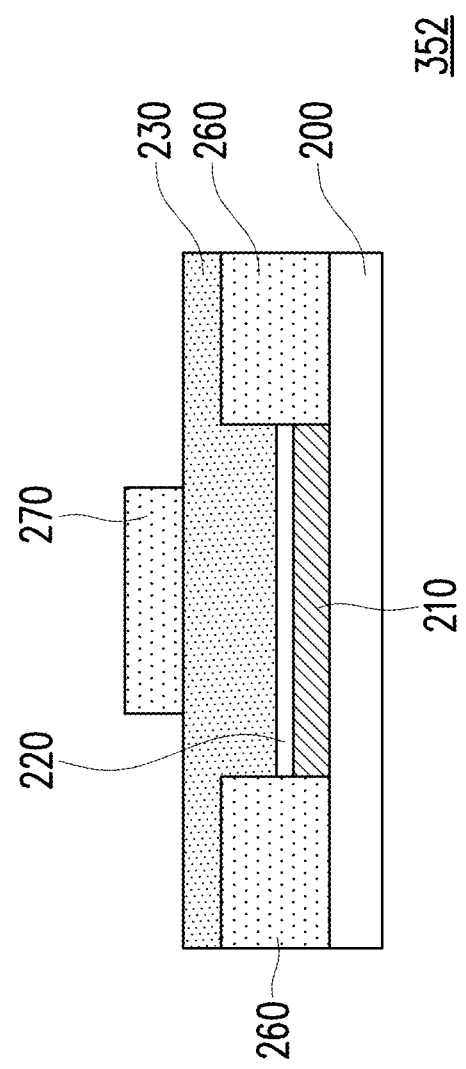
FIG. 3A
FIG. 3B

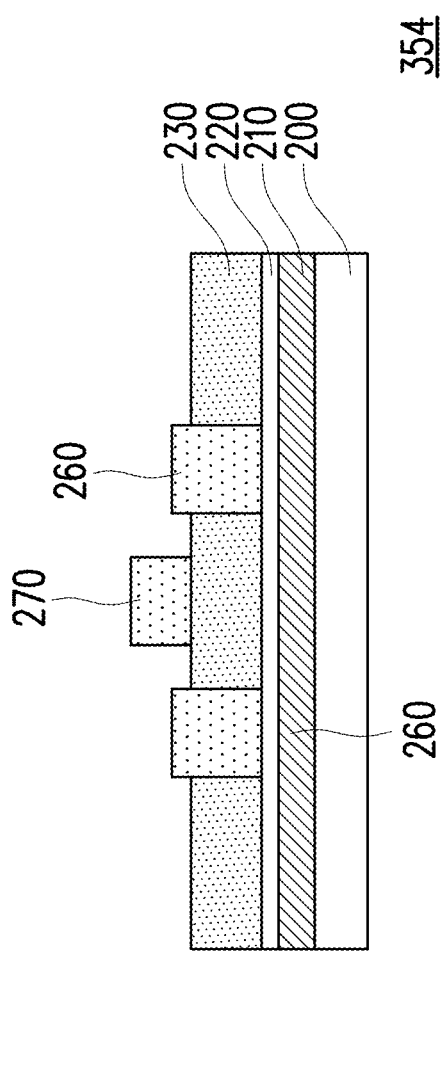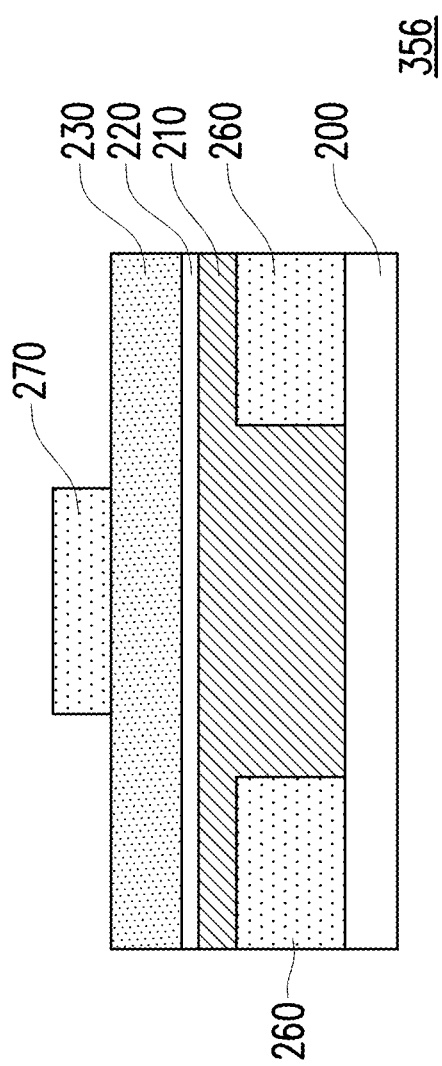

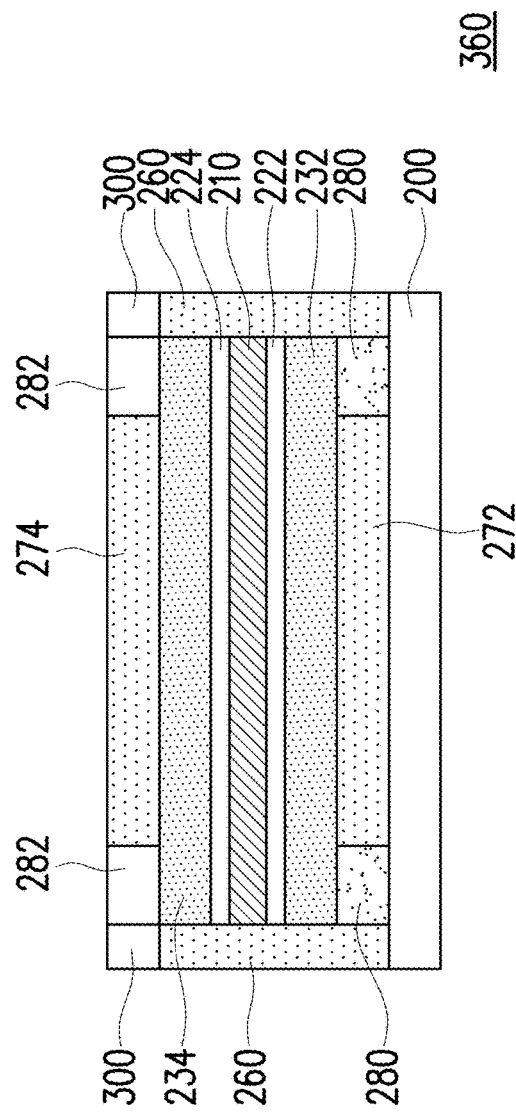
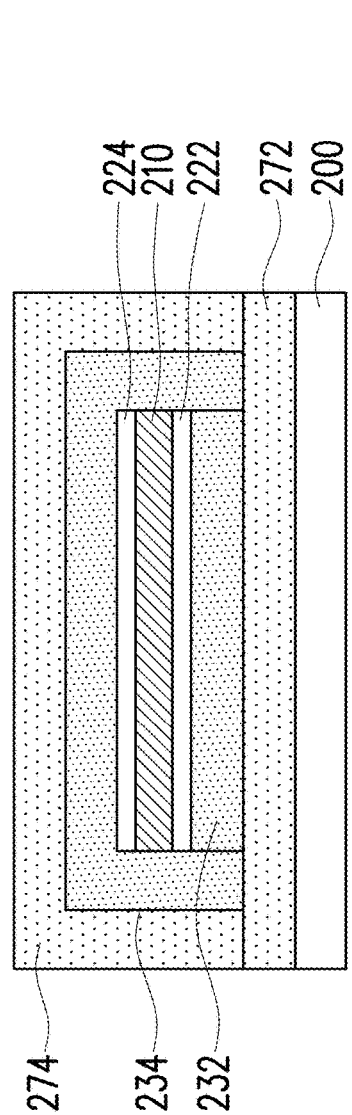

| HfO2 (ALD) |
|---|
| WS2 |

FIG. 13A

| HfO2 (PEALD) |
|---|
| WS2 |

FIG. 13B

| HfON (PEALD) |
|---|
| hBN |
| WS2 |

FIG. 13C

| HfO2 (PEALD) |
|---|
| hBN |
| WS2 |

FIG. 13D

| HfO2 (ALD) |
|---|
| hBN |
| WS2 |

FIG. 13E

| HfO2 (ALD) |
|---|
| HfON (PEALD) |
| hBN |
| WS2 |

FIG. 13F

METHODS FOR MANUFACTURING TRANSISTORS

BACKGROUND

An integrated circuit is made of large numbers of transistors. A field-effect transistor is generally composed of a substrate on which an electrically conductive gate terminal controls the flow of current between a source terminal and a drain terminal. An electrically insulating gate dielectric layer separates the gate terminal from the source and drain terminals. A semiconducting layer bridges the source and drain electrodes, and is in contact with the gate dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F illustrate various cross-sectional views of intermediate stages for forming the transistor as described in FIG. 1.

FIGS. 3A-3D are illustrations of various top-gate transistors that can be made as described in FIG. 1 in accordance with some embodiments.

FIG. 3A illustrates a top-gate side-contact transistor.

FIG. 3B is another illustration of a top-gate side-contact transistor.

FIG. 3C illustrates a top-gate top-contact transistor.

FIG. 3D illustrates a top-gate bottom-contact transistor.

FIGS. 6A-6C are different views of the gate-all-around transistor prepared according to the second method of FIG. 4.

FIG. 6A is a perspective view of the gate-all-around transistor.

FIG. 6B is a lateral cross-sectional view along line B-B of FIG. 6A.

FIG. 6C is a longitudinal cross-sectional view along line C-C of FIG. 6A.

FIGS. 13A-13F are illustrations of several structures tested in Example 4.

DETAILED DESCRIPTION

Figure 1A:
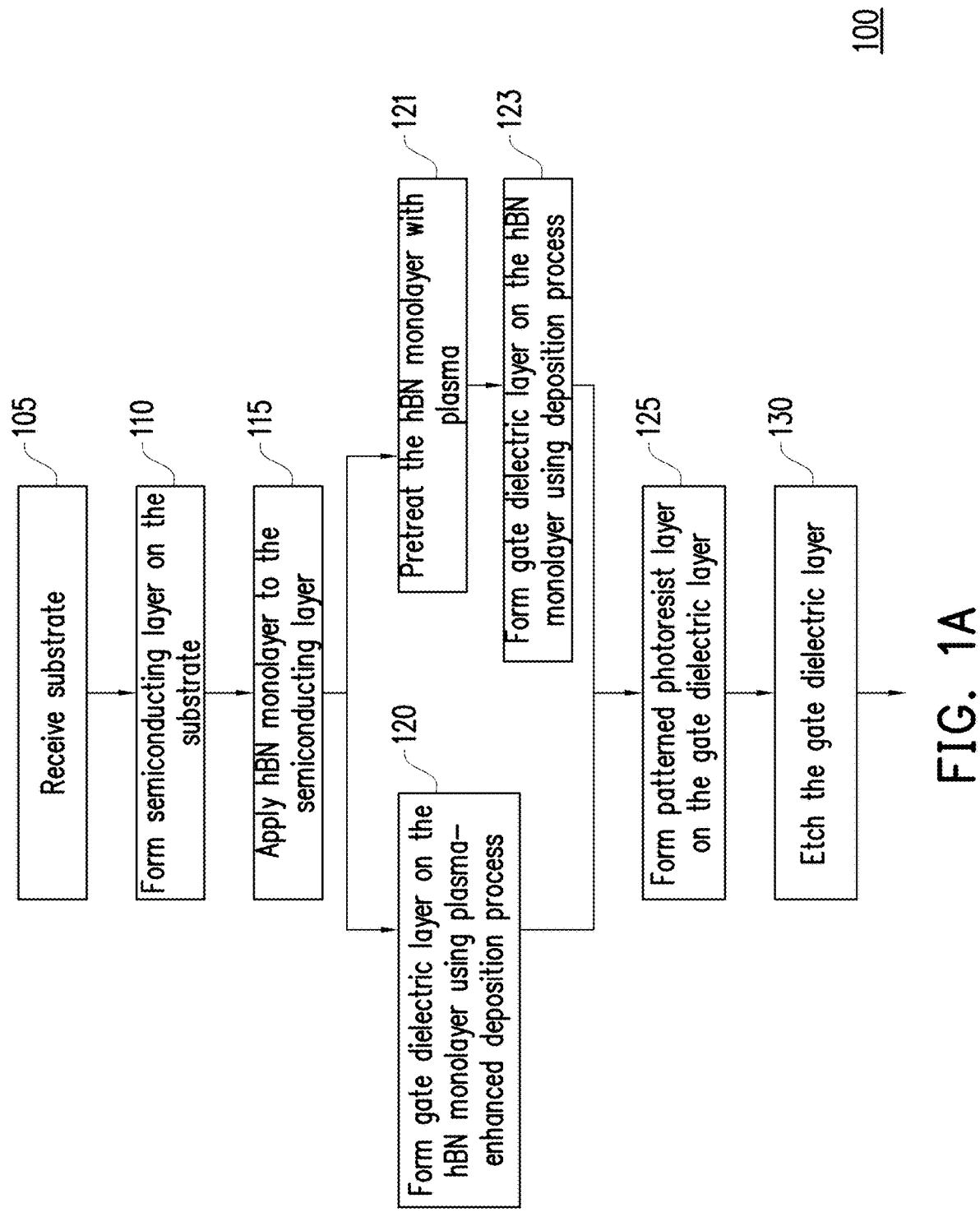
FIG. 1A and FIG. 1B together form a flow chart illustrating a first method for making a transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to transistors which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the transistor can be considered to be "on" the substrate, even though they do not all directly contact the substrate. The term "directly" may be used to indicate two layers directly contact each other without any layers in between them.

The present disclosure relates to methods for producing ultrathin high-k dielectric layers on a very thin semiconducting layer of a transistor. The semiconducting layer can be easily damaged using plasma-enhanced atomic layer deposition (PEALD) processes. Thus, in the present disclosure, a protective hexagonal boron nitride (hBN) monolayer is applied over the semiconducting monolayer. This permits PEALD to be used for deposition of the high-k dielectric layer while maintaining the integrity of the very thin semiconducting layer. The hBN monolayer itself also acts as an insulator.

Figure 1B:
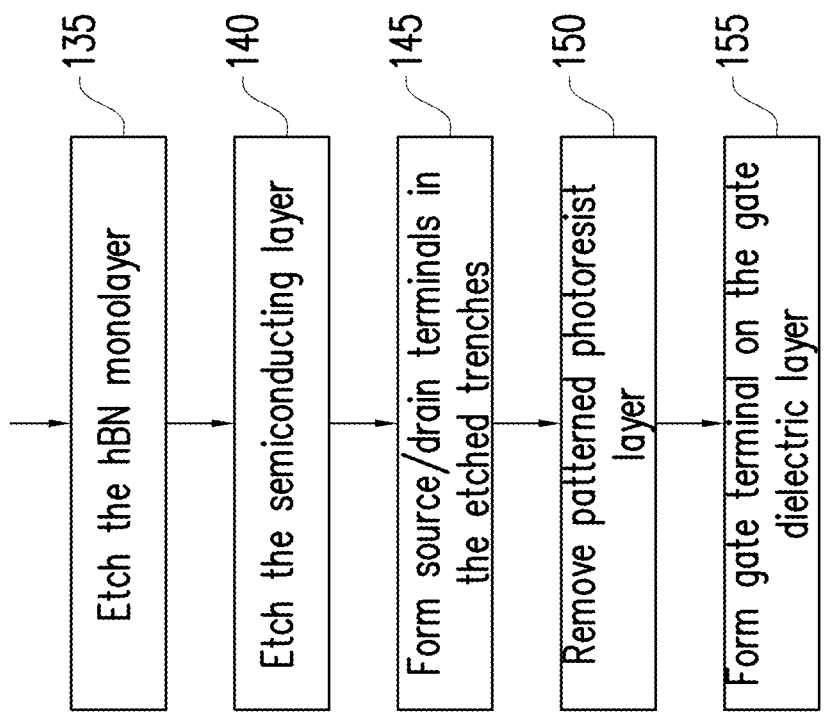

FIG. 1 is a flow chart illustrating a first method 100 for making a transistor, in accordance with some embodiments. FIGS. 2A-2F illustrate various steps of the first method, and these figures are discussed together. These figures are illustrated with reference to a top-gate transistor.

Referring now to FIG. 1, in step 105, a substrate is received or provided. The substrate is usually a wafer made of a semiconducting material. Such materials can include silicon, for example in the form of crystalline Si or polycrystalline Si. The substrate can also be made from other elementary semiconductors such as germanium or $Al_2O_3$ (sapphire), or may include a compound semiconductor such as silicon carbide (SiC), gallium arsenide (GaAs), indium arsenide (InAs), and indium phosphide (InP).

Next, in step 110, a semiconducting layer is formed on the substrate. In more specific embodiments, the semiconducting layer is a monolayer. Examples of suitable materials for a semiconducting monolayer include transition metal dichalcogenides such as $MoS_2$, $MoSe_2$, $W_{S2}$, $WSe_2$, $SnS_2$, and $ReS_2$, or other materials such as InSe, phosphorene, tellurene, or graphene. The semiconducting layer can be formed using processes such as atomic layer deposition (ALD) or chemical vapor deposition (CVD). FIG. 2A illustrates the result of this step, with a substrate 200 and a semiconducting layer 210 deposited on the substrate. In particular embodiments, the semiconducting layer may have a thickness 215 of about 0.4 nanometers to about 1.5 nanometers.

In step 115, a hexagonal boron nitride (hBN) monolayer is applied upon the semiconducting layer. The hBN monolayer can be formed using processes such as atomic layer deposition (ALD) or chemical vapor deposition (CVD). FIG. 2B illustrates the result of this step, with the hBN monolayer 220 located upon the semiconducting layer 210. It is noted that the hBN monolayer also acts as an insulator. The hBN monolayer has a thickness 225 of about 0.4 nanometers to about 0.8 nanometers.

In some other embodiments, the hBN monolayer is grown on a separate surface, then removed from the separate surface and transferred to the semiconducting layer. For example, a Cu (111) thin film can be used as the substrate for the formation of an hBN monolayer from ammonia borane in the presence of hydrogen gas under relatively low heat and pressure. A poly(methyl methacrylate) (PMMA) film is coated onto the hBN monolayer, and a thermal release tape (TRT) is then applied to the PMMA film. The hBN monolayer is then electrochemically delaminated. The TRT/PMMA/hBN stacked film can then be placed onto the semiconducting layer. The TRT can be released by baking, and the PMMA film can be released by immersion in an appropriate solvent, leaving behind the hBN monolayer.

Next, a gate dielectric layer is formed upon the hBN monolayer. In some embodiments indicated by step 120, the gate dielectric layer is formed using a plasma-enhanced deposition process, such as plasma-enhanced atomic layer deposition (PEALD) or plasma-enhanced chemical vapor deposition (PECVD). Generally, in either PEALD or PECVD, one or more gaseous precursors are converted into a charged plasma, which results in chemical reaction and deposition on the substrate. The use of plasma permits these deposition processes to be performed at lower temperatures (<200° C.). In other embodiments indicated by steps 121 and 123, the hBN monolayer is pretreated with plasma, and an ALD or CVD deposition process is then used to form the gate dielectric layer.

It is noted that many semiconducting materials, such as the transition metal dichalcogenides, can be damaged by the highly reactive oxygen or nitrogen atoms present in the plasma. Because hexagonal boron nitride (hBN) has very strong covalent bonds between the boron and nitrogen atoms, it is not easily damaged by plasma treatment, and serves to protect the semiconducting layer.

The gate dielectric layer may be formed from silicon dioxide ($SiO_2$), but is more desirably made of a high-k dielectric material. In embodiments, the high-k dielectric material has a dielectric constant higher than 5, or higher than 7, or higher than 10. Examples of suitable high-k dielectric materials include hafnium dioxide ($HfO_2$), zirconium dioxide ($ZrO_2$), aluminum oxide ($Al_2O_3$), hafnium oxynitride ($HfO_xN_y$) or zirconium oxynitride ($ZrO_xN_y$), or hafnium silicates ($ZrSi_xO_y$) or zirconium silicates ($ZrSi_xO_y$). FIG. 2C illustrates the result of this step, with the gate dielectric layer 230 located upon the hBN monolayer 220.

Continuing, in step 125, a photoresist layer is deposited and patterned. This is done by exposing the photoresist to patterned light, and then developing the photoresist to obtain a patterned photoresist layer. FIG. 2D illustrates the result of this step, with the patterned photoresist layer 240 located upon the gate dielectric layer 230.

In step 130, the gate dielectric layer 230 is etched. In step 135, the hBN monolayer 220 is etched. In step 140, the semiconducting layer 210 is etched. FIG. 2E illustrates the result of these steps, with trenches 250 present in these three layers. The substrate 200 is again exposed at the bottom of the trenches.

Generally, any etching step may be performed using wet etching, dry etching, or plasma etching processes such as reactive ion etching (RIE) or inductively coupled plasma (ICP), as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), nitrogen trifluoride ($NF_3$), or the like, or combinations thereof in various ratios. For example, the gate dielectric layer may be etched using a fluorine-containing etchant. As another example, the hBN monolayer can be etched using $SF_6$, Ar, or $H_2/N_2$.

In step 145, source/drain terminals 260 are formed in the trenches via deposition of an appropriate electrically conductive material. A semiconducting channel 217 is thus defined between the source/drain terminals 260. FIG. 2F illustrates the result of these steps. Note that the semiconducting layer 210 is located only between the source/drain terminals 260, and is not located above or below the terminals.

In step 150, the patterned photoresist layer 240 is removed. A second patterned photoresist layer may be applied, as previously described. In step 155, a gate terminal 270 is then formed upon the gate dielectric layer 230. The second patterned photoresist layer is then removed. FIG. 3A illustrates the result of step 150, which is a top-gate side-contact transistor 350. In some particular embodiments, the gate terminal may have a thickness 275 of about 6 nanometers to about 50 nanometers.

The material used for the source/drain terminals 260 and the gate terminal 270 may be any suitable electrically conductive material. Examples of such materials may include metals such as TiN, Pt, Co, Rh, Pd, Ti, Ta, and the like.

Similar process steps can be used to form different types of top-gate transistors. FIG. 3B illustrates another top-gate side-contact transistor 352. Here, the source/drain terminals 260 are formed before the gate dielectric layer 230 is applied. The gate dielectric layer also covers the source/drain terminals, while the semiconducting layer 210 and the hBN monolayer 220 are located between the source/drain terminals 260.

As another example, FIG. 3C illustrates a top-gate top-contact transistor 354. Here, only the gate dielectric layer 230 is etched. The hBN monolayer 220 and the semiconducting layer 210 are not etched. The source/drain terminals 260 are formed upon the hBN monolayer 220, rather than contacting the substrate 200 as in FIG. 3A.

Finally, FIG. 3D illustrates a top-gate bottom-contact transistor 356. Here, the source/drain terminals 260 are formed upon the substrate 200 first, and the semiconducting layer 210 is then applied. The semiconducting layer also covers the source/drain terminals. It is noted that in this transistor, the semiconducting layer is relatively thick compared to those illustrated in FIGS. 3A-3C. The hBN monolayer 220 is then applied to protect the semiconducting layer during application of the gate dielectric layer 230.

It is noted that the side-contact embodiments of FIG. 3A and FIG. 3B can advantageously reduce the Fermi-level pinning effect which can occur at the interface of a semiconductor and a metal. Conceptually, the Schottky barrier height (SBH) at the semiconductor-metal interface is related to the work function of the metal. However, this is not always true for transitional metal dichalcogenides (TMDs), and interface states can result in Fermi-level pinning, wherein the SBH becomes unrelated to the work function. As a result, undesirable high contact resistance cannot be controlled by the choice of metal. The use of the hBN monolayer is believed to aid in depinning.

In addition, the use of the hBN monolayer is believed to screen charge impurities which can cause carrier scattering. Carrier scattering is related to the dielectric constant of the surfaces contacting the semiconducting layer. The hBN monolayer has a dielectric constant of about 5, which is much higher than the dielectric constant of air (~1). Thus, carrier scattering is reduced due to the high dielectric constant of the hBN monolayer. In addition, the higher dielectric constant material is more suitable for an ultralow equivalent oxide thickness (EOT) capacitance. Finally, hBN has a thermal conductivity as high as 550 W/m-K, and so can serve as a good heat dissipation medium that aids in cooling the transistor during operation.

Figure 4A:
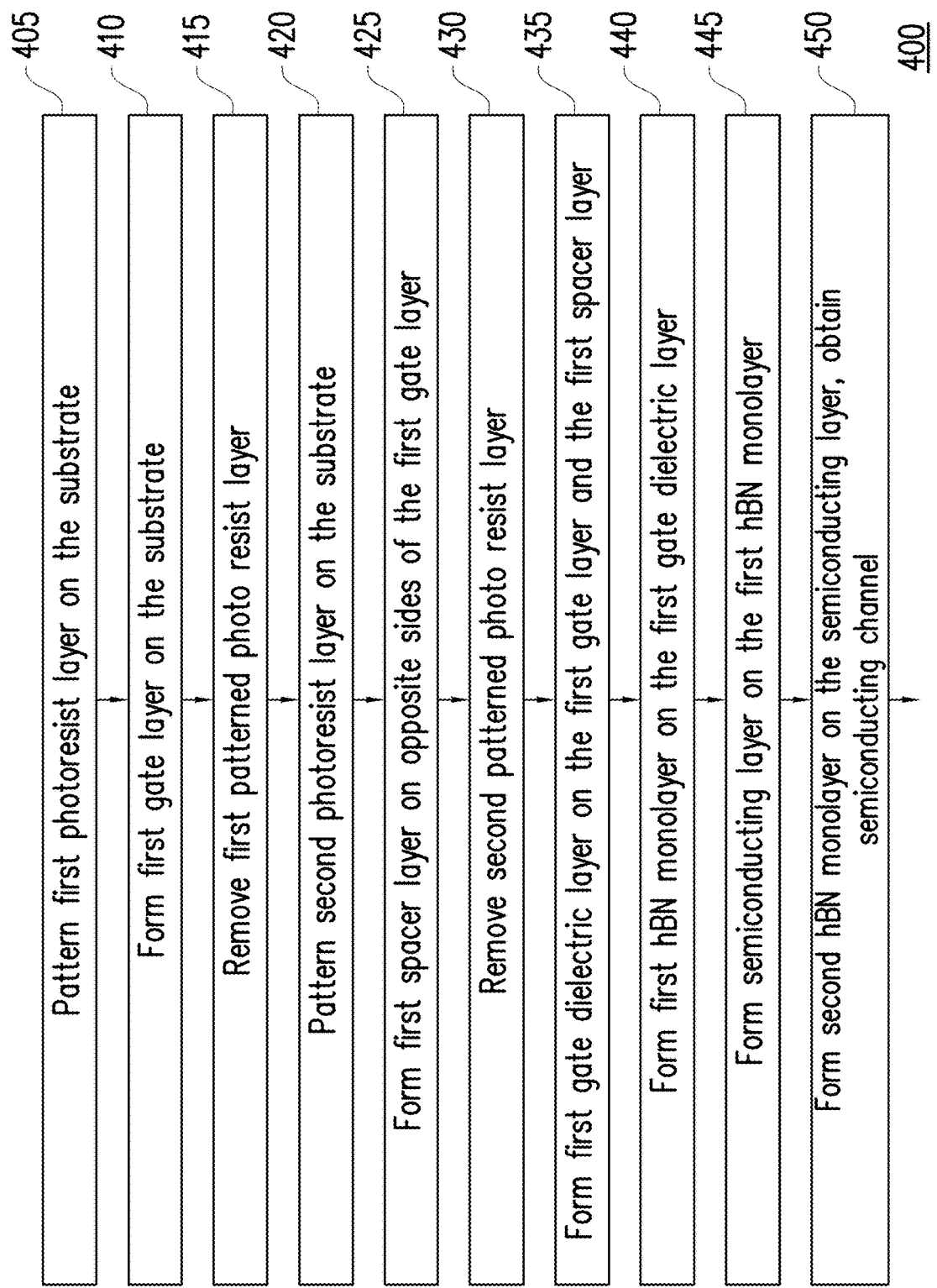
FIG. 4A and FIG. 4B together form a flow chart illustrating a second method for making a gate-all-around (GAA) transistor with one semiconducting channel, in accordance with some embodiments.
Figure 4B:
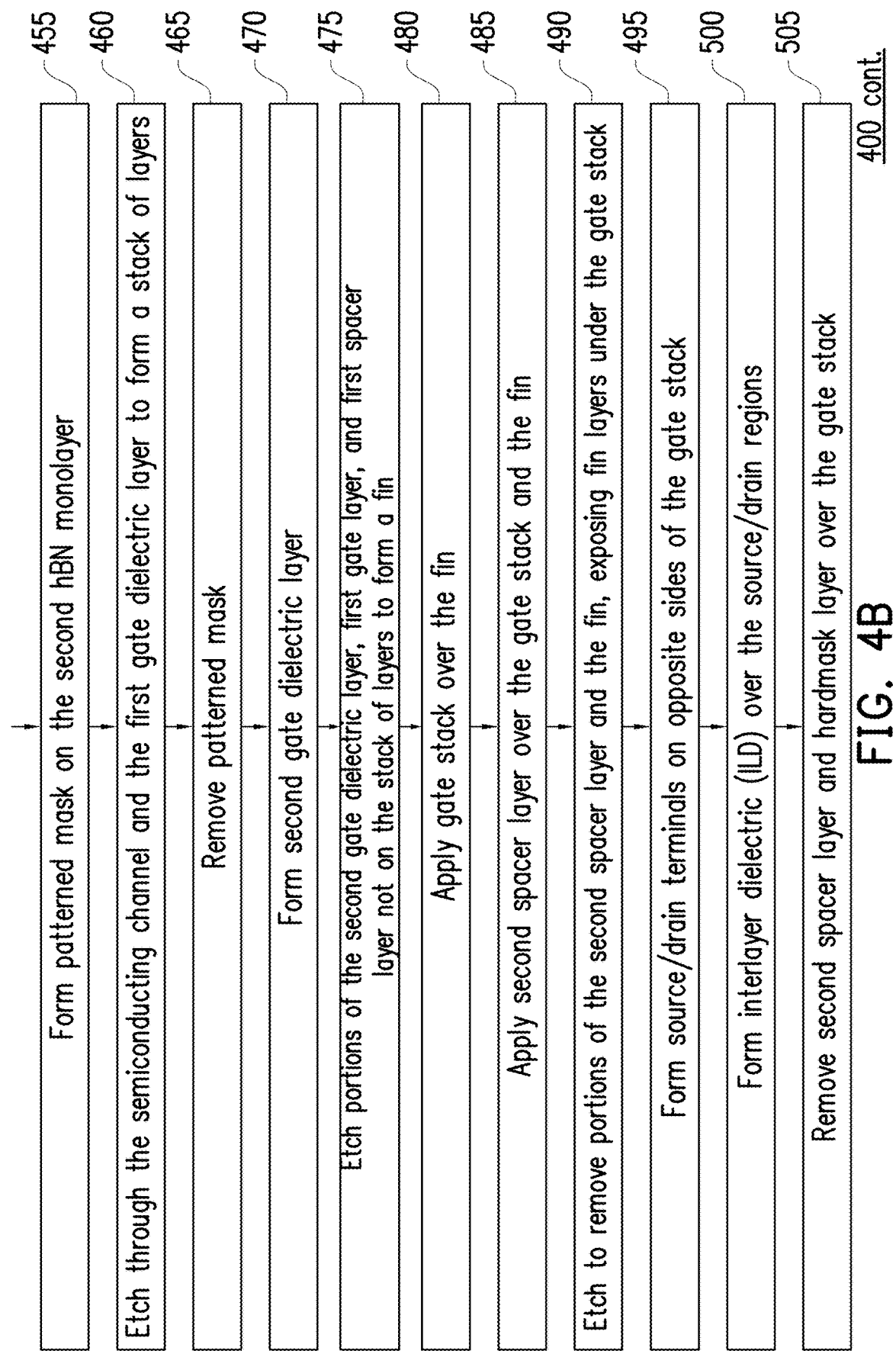
Figure 5A:
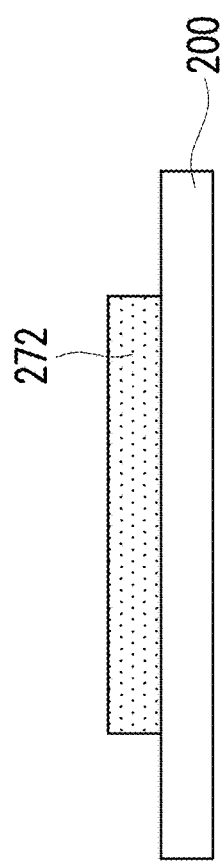
FIGS. 5A-5N illustrate various cross-sectional views of intermediate stages for forming the gate-all-around transistor as described in FIG. 4.
Figure 5B:
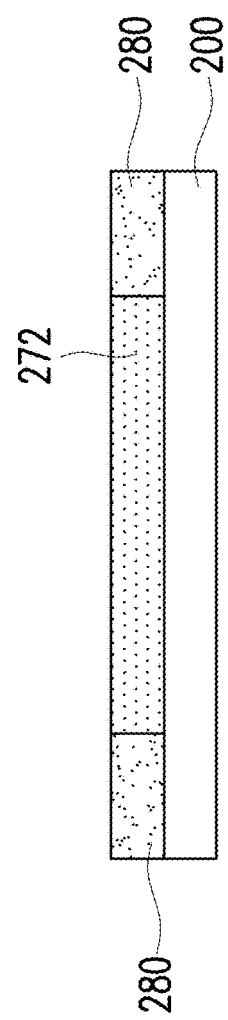
Figure 5C:
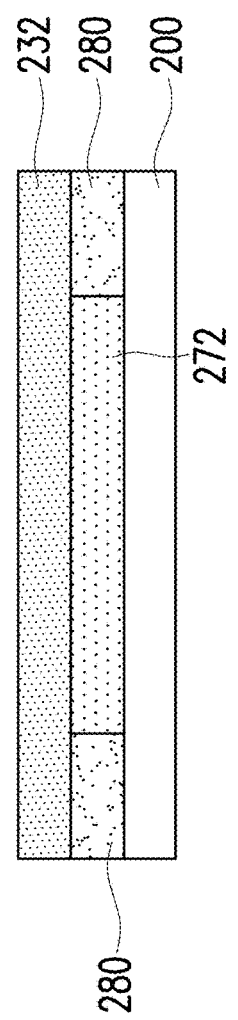

Continuing, FIG. 4A and FIG. 4B are a flow chart illustrating a second method 400 for making a transistor, in accordance with some embodiments. FIGS. 5A-5N illustrate various steps of the second method, and these figures are discussed together. These figures are illustrated with reference to a gate-all-around (GAA) transistor.

In step 405, a first photoresist layer is deposited and patterned on a substrate. In step 410, a first gate layer is formed upon the substrate. The first gate layer can be formed using, for example, ALD, CVD, sputtering, or any other known method. In step 415, the first patterned photoresist layer is then removed. FIG. 5A shows the result of this step, with first gate layer 272 upon the substrate 200.

In step 420, a second photoresist layer is then deposited and patterned. In step 425, a first spacer layer is formed on opposite sides of the first gate layer. The first spacer layer can be formed, for example, by thermal oxidation, ALD or CVD (whether plasma-enhanced or not), sputtering, or any other known method. The first spacer layer can be made of any dielectric material, and may also be a high-k dielectric material as previously described. FIG. 5B shows the result after these steps. The first spacer layer 280 is on the same level as the first gate layer 272. In step 430, the second patterned photoresist layer is removed.

In step 435, a first gate dielectric layer is formed upon the first gate layer and the first spacer layer. The first gate dielectric layer can be formed, for example, by thermal oxidation, CVD, sputtering, or any other known method. The first gate dielectric layer can be made of any dielectric material, and may also be a high-k dielectric material as previously described. As illustrated in FIG. 5C, the first gate dielectric layer 232 covers both the first gate layer 272 and the first spacer layer 280.

Figure 5D:
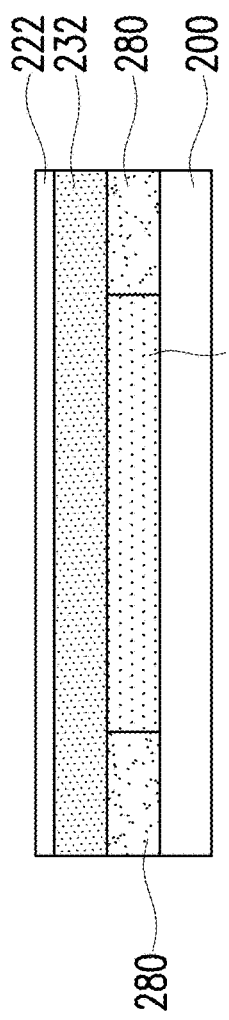

In step 440, as illustrated in FIG. 5D, a first hexagonal boron nitride (hBN) monolayer 222 is formed upon the first gate dielectric layer 232. The hBN monolayer can be grown and formed upon the first gate dielectric layer, or can be transferred as previously described.

Figure 5E:
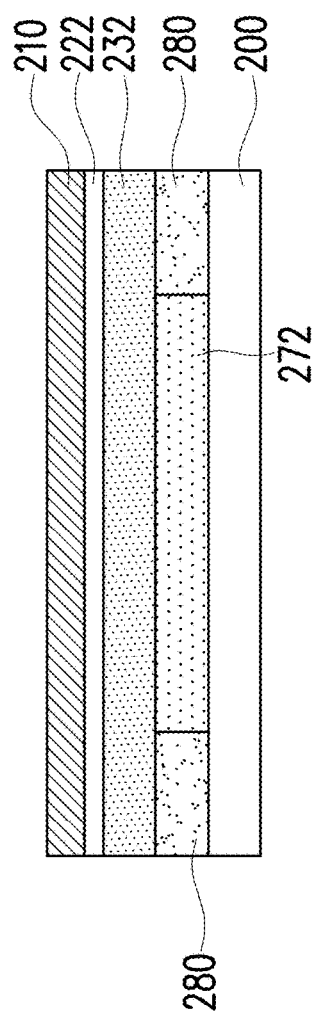

In step 445, as illustrated in FIG. 5E, a semiconducting layer 210 is formed upon the first hexagonal boron nitride (hBN) monolayer 222.

Figure 5F:
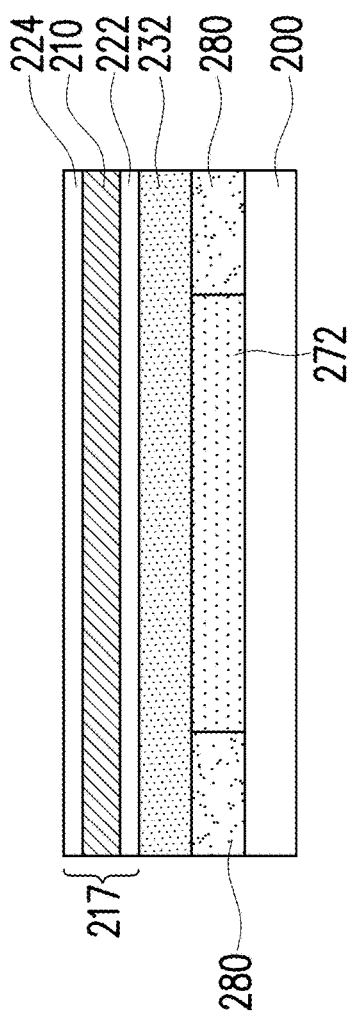

In step 450, as illustrated in FIG. 5F, a second hBN monolayer 224 is formed upon the semiconducting layer 210. A semiconducting channel 217 is formed which is made up of the first hBN monolayer 222, the semiconducting layer 210, and the second hBN monolayer 224. It is noted that the two hBN monolayers are insulators and serve a protective function in the semiconducting channel. The two hBN monolayer themselves are not semiconductors.

Figure 5G:
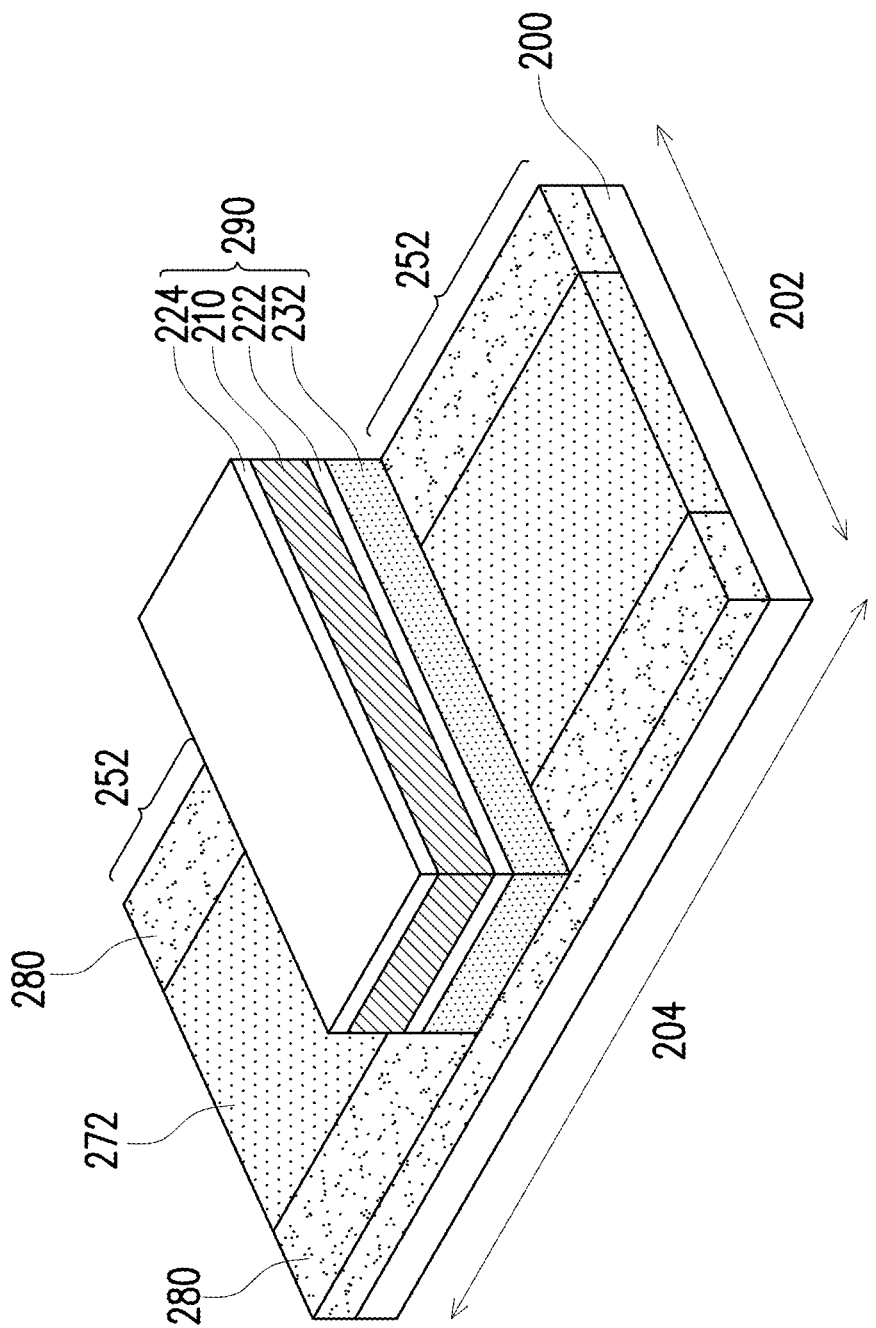

Next, in step 455, a photoresist layer is applied to the second hBN monolayer and patterned to form a mask. Then, in step 460, etching is performed through the second hBN monolayer 224, the semiconducting layer 210, the first hBN monolayer 222, and the first gate dielectric layer 232. The first gate layer 272 is not etched. In essence, a stack 290 of layers is formed, with trenches 252 on either side of the stack 290. Each layer will be etched using suitable etchants. A perspective view of the resulting structure is shown in FIG. 5G, which is marked with a lateral direction 202 and a longitudinal direction 204. In step 465, the patterned mask is removed.

Figure 5H:
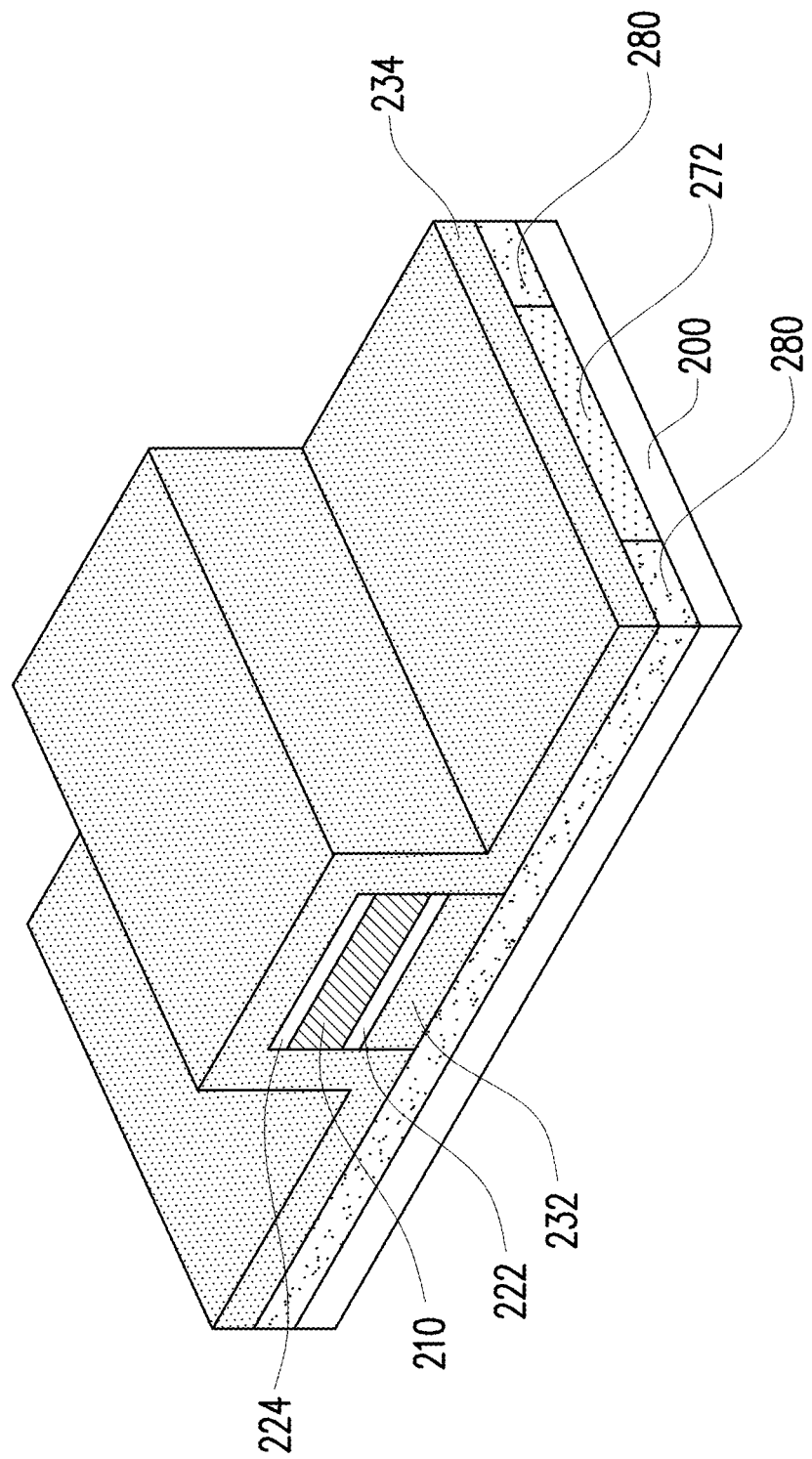

In step 470, as illustrated in FIG. 5H, a second gate dielectric layer is formed upon the substrate. Again, the second gate dielectric layer can be made of any dielectric material, and may also be a high-k dielectric material as previously described. As seen here, the second gate dielectric layer 234 covers the horizontal surfaces of the second hBN monolayer 224, the first gate layer 272, and the first spacer layer 280. The vertical surfaces of the exposed layers in the stack 290 are also covered by the second gate dielectric layer.

In some embodiments, this step is performed using a plasma-enhanced deposition process as previously described. In other embodiments, the second hBN monolayer is pretreated with plasma, and an ALD or CVD deposition process is then used to form the second gate dielectric layer.

It should be noted that the lateral edges of the semiconducting layer 210 and the two hBN monolayers 222, 224 are exposed, and so some damage may occur to these layers due to the plasma treatment. However, it is contemplated that any damage will be limited to the edges of these three layers, and damage will not occur to the unexposed portions of these three layers.

Figure 5I:
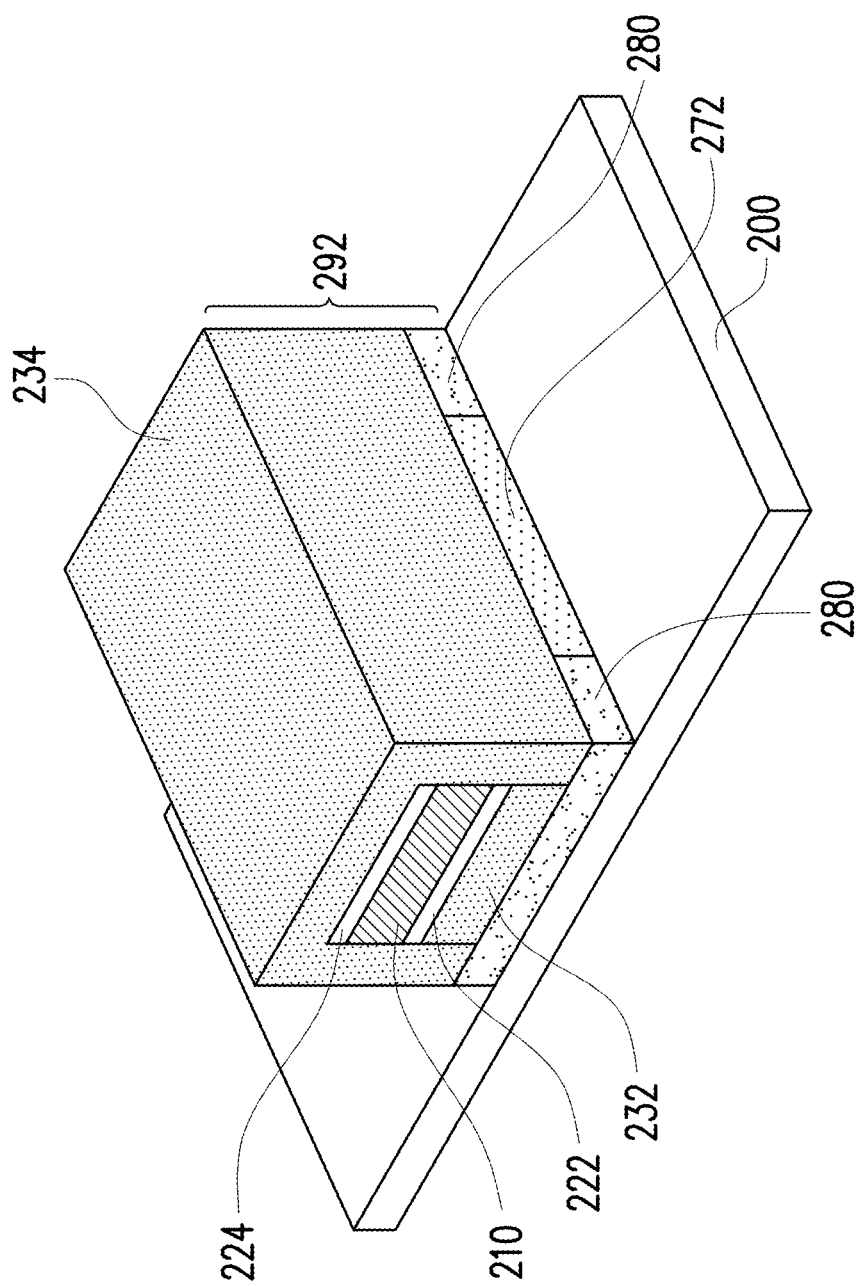

Next, another photoresist layer is applied to the second gate dielectric layer and patterned. Then, in step 475, etching is performed to remove the portions of the second gate dielectric layer that do not surround the stack 290, as well as the underlying portions of the first gate layer 272 and the first spacer layer. A perspective view of the resulting structure is shown in FIG. 5I. As seen here, the second gate dielectric layer has three sides, and overlaps the lateral sides of the first hBN monolayer 222, the semiconducting layer 210, and the second hBN monolayer 224. The first gate dielectric layer 232 and the second gate dielectric layer 234 together surround the first hBN monolayer 222, the semiconducting layer 210, and the second hBN monolayer 224. The first gate layer 272 and the first spacer layer 280 are exposed on their lateral surfaces. The patterned photoresist layer is then removed. A fin 292 is thus formed from the first gate layer 272 and the first spacer layer 280, the first gate dielectric layer 232, the first hBN monolayer 222, the semiconducting layer 210, the second hBN monolayer 224, and the second gate dielectric layer 234. In very general embodiments, the initial fin length may range from about 20 nm to about 1200 nm. In general embodiments, the initial fin width may range from about 4 nm to about 20 nm. The photoresist layer is then removed.

Continuing, a new photoresist layer is applied to the second gate dielectric layer and patterned. Then, in step 480, a gate stack 274 is applied over the fin 292. The gate stack may include a hardmask layer 276. The gate stack can be formed, for example, by ALD, CVD, sputtering, or any other known method. The patterned photoresist layer is then removed.

Figure 5J:
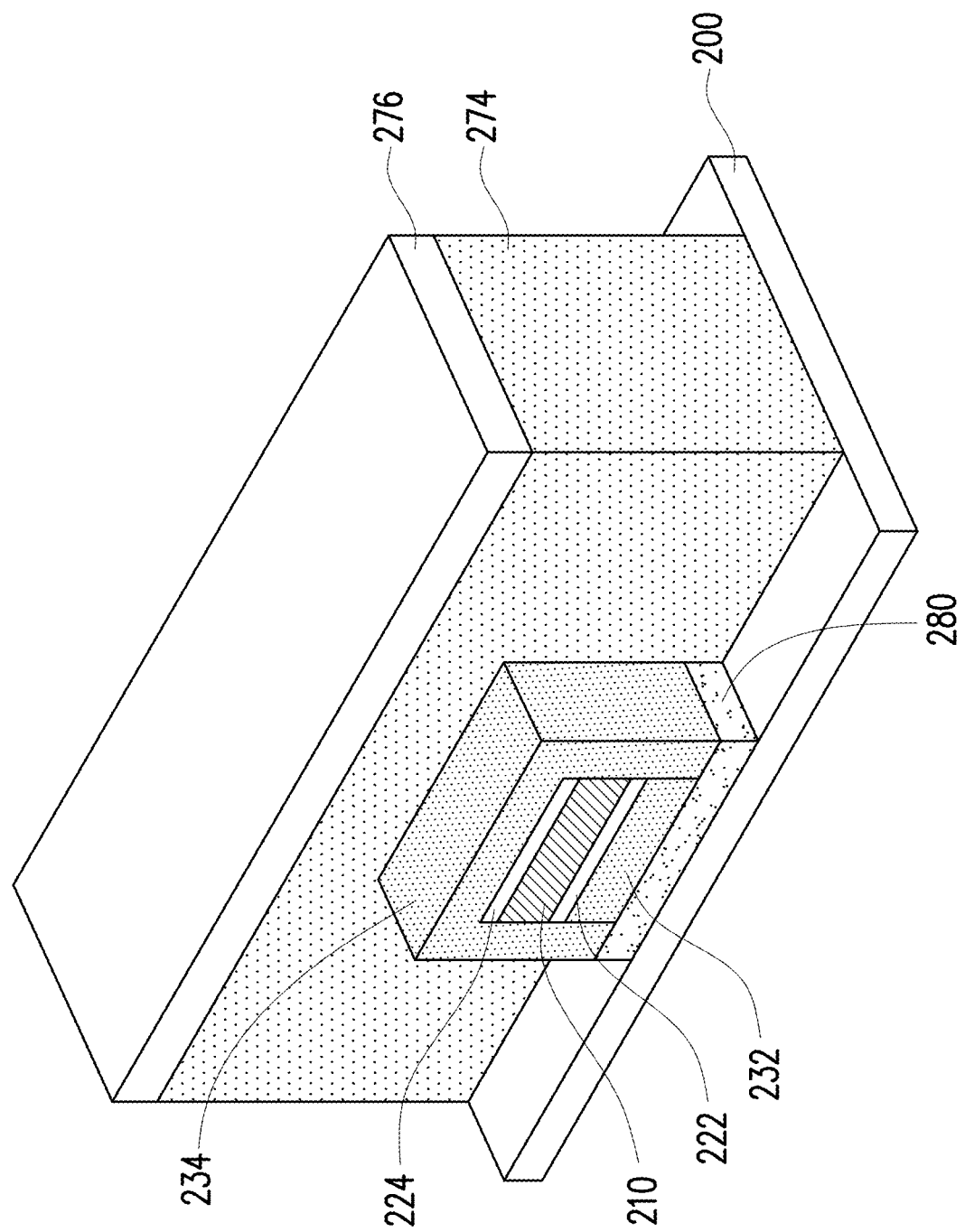

Referring to the resulting structure as illustrated in FIG. 5J, please note that the gate stack covers the central portion of the fin, and the two end portions of the fin are still exposed. The gate stack 274 covers the lateral surfaces of the first gate layer and also portions of the first spacer layer as well. As will be seen later, the first spacer layer is used to electrically insulate the gate stack. As a result, the gate stack 274 and the first gate layer (not visible) together surround the two gate dielectric layers 232, 234, the two hBN monolayers 222, 224, and the semiconducting layer 210. The gate stack 274 is also used to define and form source/drain regions.

Figure 5K:
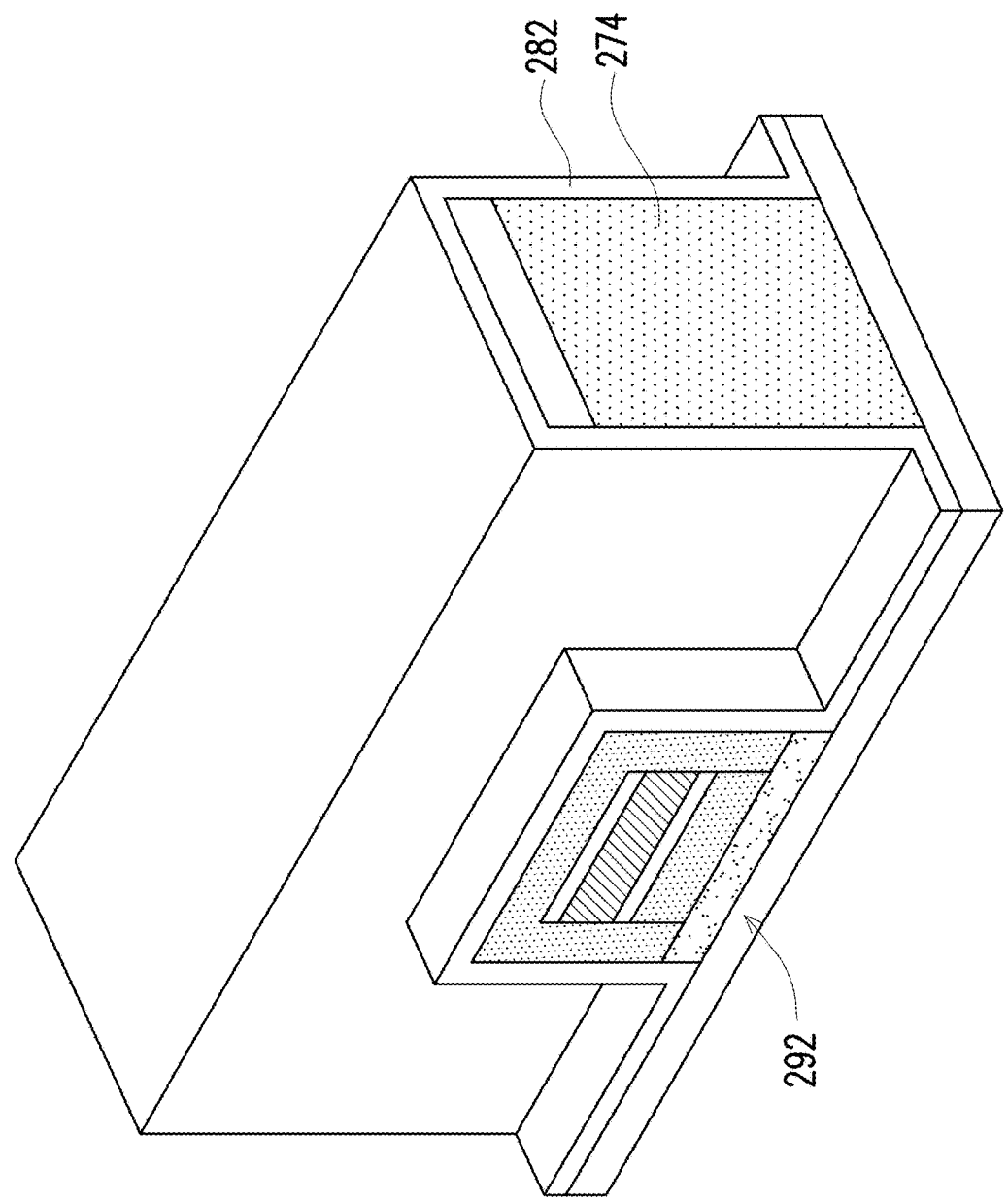

In subsequent step 485, a second spacer layer 282 is applied over the gate stack 274 and the fin 292. The second spacer layer may be a single layer or formed from multiple sub-layers. The second spacer layer can be formed, for example, by ALD, CVD, sputtering, or any other known method. The second spacer layer can be made of any dielectric material, and may also be a high-k dielectric material as previously described. The resulting structure is illustrated in FIG. 5K.

Figure 5L:
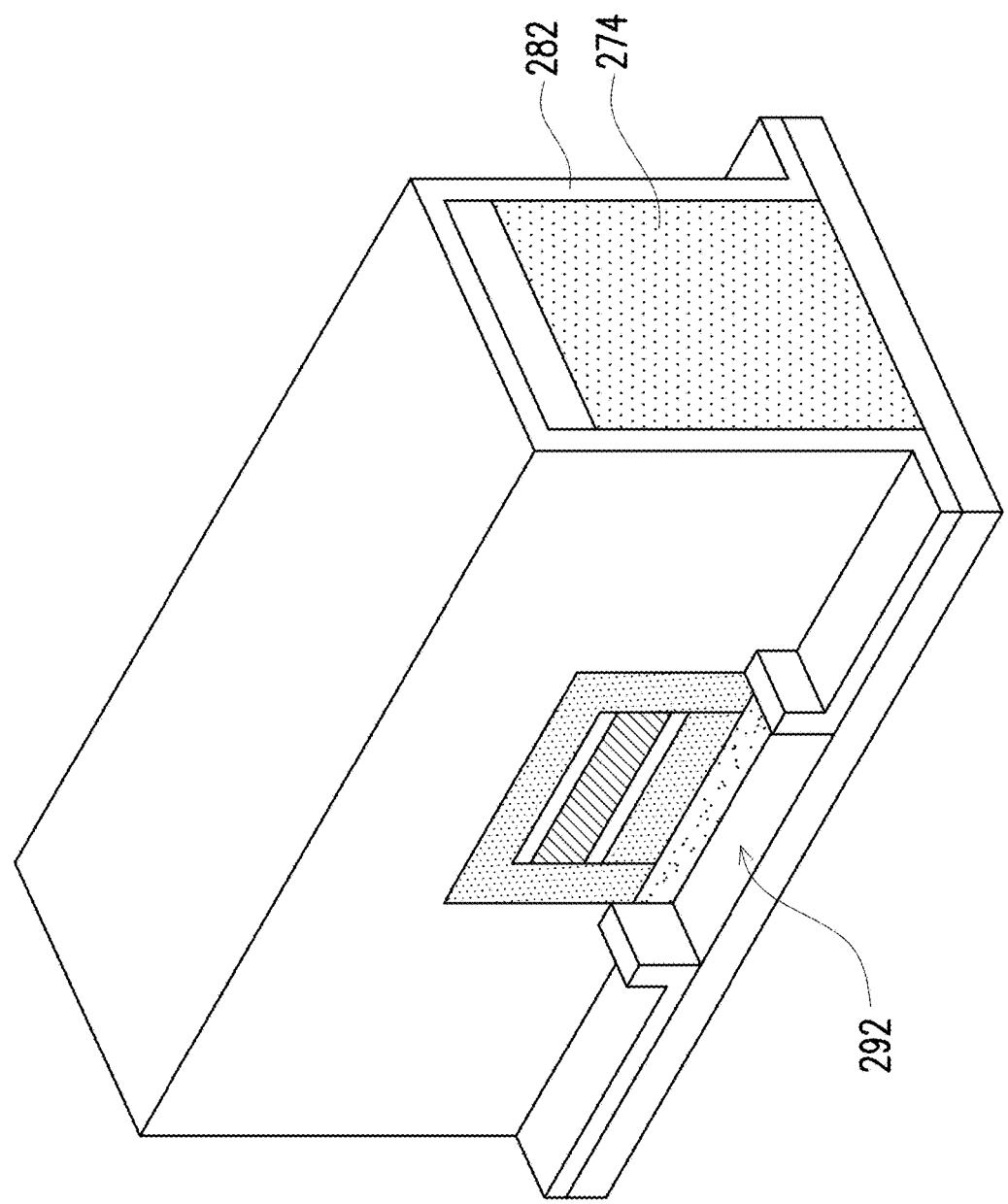

Next, in step 490, the structure is anisotropically etched to remove portions of the second spacer layer 282 and the fin 292. After the etching, as illustrated in FIG. 5L, the various layers in the fin 292 are aligned with the gate stack 274 and are exposed through the longitudinal surfaces of the second spacer layer 282. Put another way, the second spacer layer and the fin are etched so that the fin layers under the gate stack are exposed.

Figure 5M:
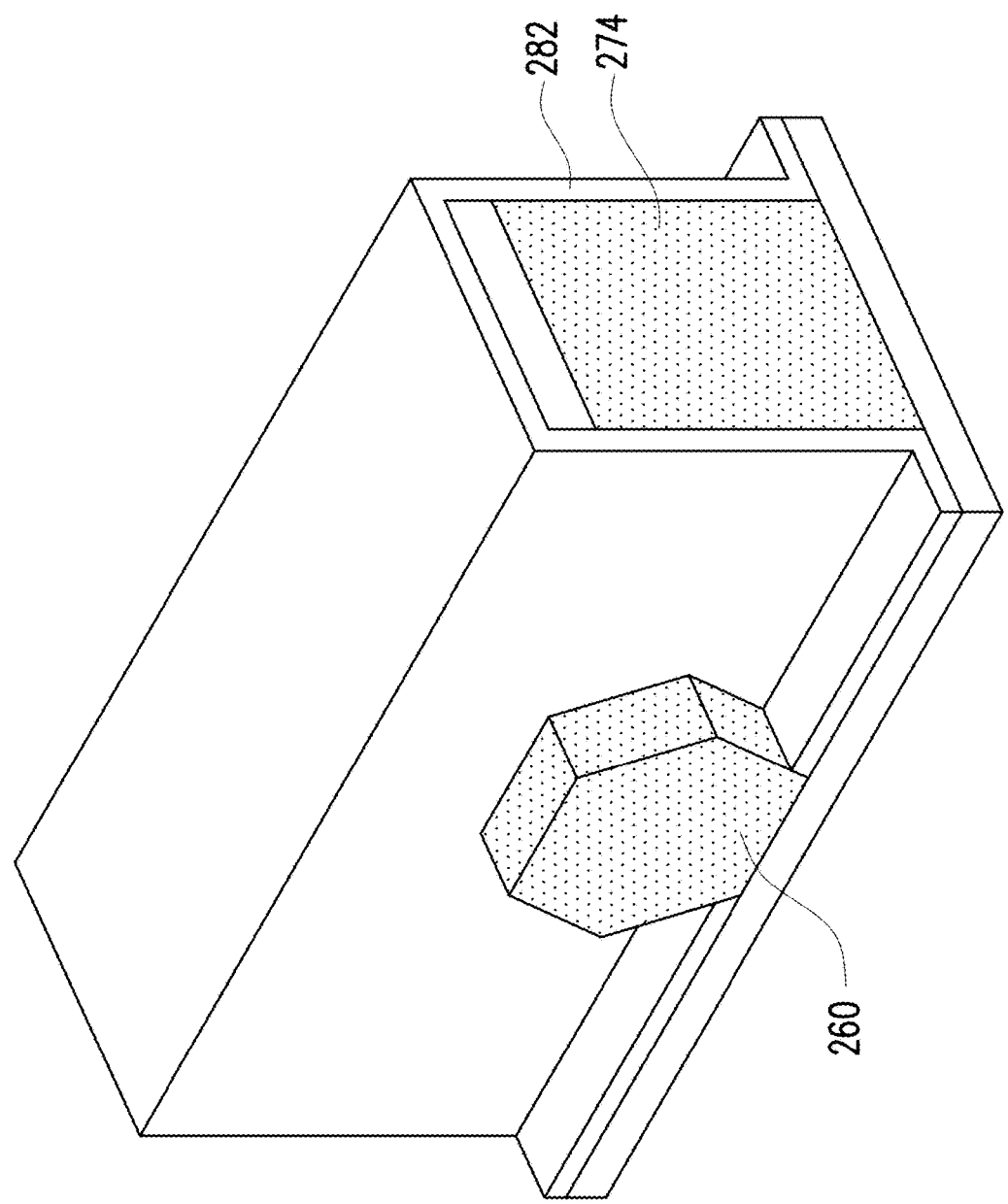
Figure 5N:
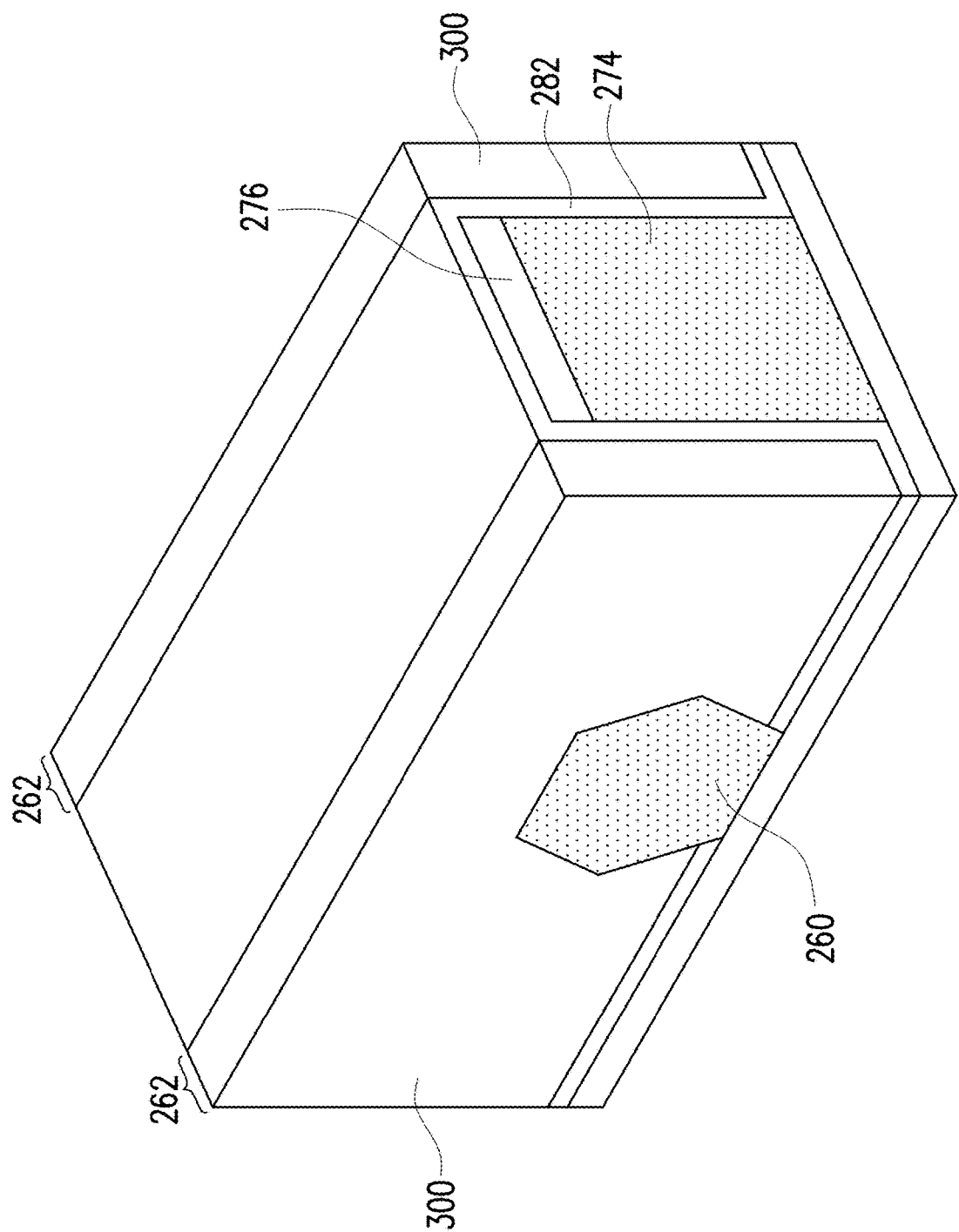

Next, in step 495, as illustrated in FIG. 5M, source/drain terminals 260 are formed on opposite sides of the gate stack 274, adjacent to the exposed sides of the gate stack (no longer visible). The source/drain terminals are usually made from a metal and can be formed using, for example, ALD, CVD, sputtering, or any other known method. The resulting source/drain terminals 260 may have any resulting shape. In this figure, only one source/drain region is visible, and for illustrative purposes is drawn here as a hexagon. Annealing may also occur. The source/drain terminals 260 are separated from the gate stack 274 by the second spacer layer 282.

Continuing, in step 500, an interlayer dielectric (ILD) is formed over the source/drain regions 262. Referring to FIG. 5N, the ILD 300 may be formed from any dielectric material, and does not need to be a high-k dielectric material. Suitable dielectrics could include silicon dioxide ($SiO_2$), phosphosilicate glass (PSG), fluorosilicate glass (FSG), undoped silicate glass (USG), high-stress undoped silicate glass (HSUSG), borosilicate glass (BSG), or any combination thereof. The ILD can be deposited using any appropriate method, for example CVD.

Figure 6A:
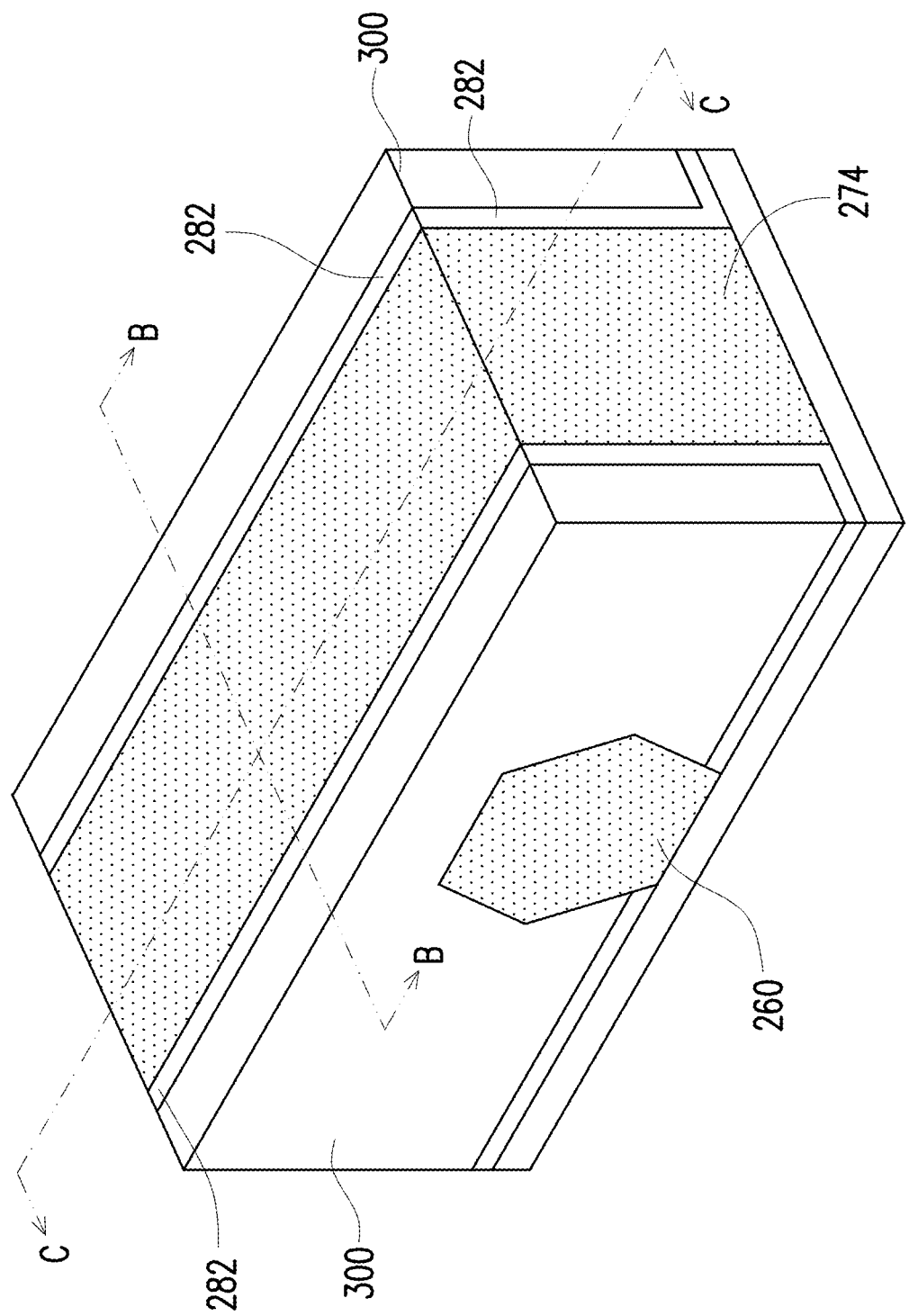

Next, in step 505, the second spacer layer 282 is removed from the gate stack 274, to expose the gate stack 274. If the hardmask layer 276 is present in the gate stack, the hardmask layer is also removed. This can be done by wet etching or dry etching. In some embodiments, chemical-mechanical planarization (CMP) is used to remove one or both layers, as well as some portion of the ILD. The result of this step is shown in FIG. 6A. As seen here, the second spacer layer 282 separates the gate stack 274 from the source/drain regions 260. This final structure is a GAA transistor 360.

FIG. 6B is a cross-sectional view of the GAA transistor in the lateral direction along line B-B of FIG. 6A. The source/drain terminals 260 are on each side, and are separated from the first gate layer 272 and gate stack 274 by the first spacer layer 280 and the second spacer layer 282. It is noted that the first spacer layer 280 and the second spacer layer 282 may have different widths from each other.

FIG. 6C is a cross-sectional view of the GAA transistor in the longitudinal direction along line C-C of FIG. 6A. As can be seen here, the semiconducting layer 210 is above the first hBN monolayer 222 and below the second hBN monolayer 224, and together can be considered to form a semiconducting channel 217. The first gate dielectric layer 232 and the second gate dielectric layer 234 combine to surround the semiconducting channel 217. The first gate layer 272 and the gate stack 274 together combine to surround the two gate dielectric layers 232, 234.

In FIGS. 5A-5N, the GAA transistor is illustrated with reference to one fin 292 or fin. In production, multiple stacks or fins may be made at one time. It is contemplated, then, that additional processing steps can be performed to electrically isolate the fins from each other.

Figure 7A:
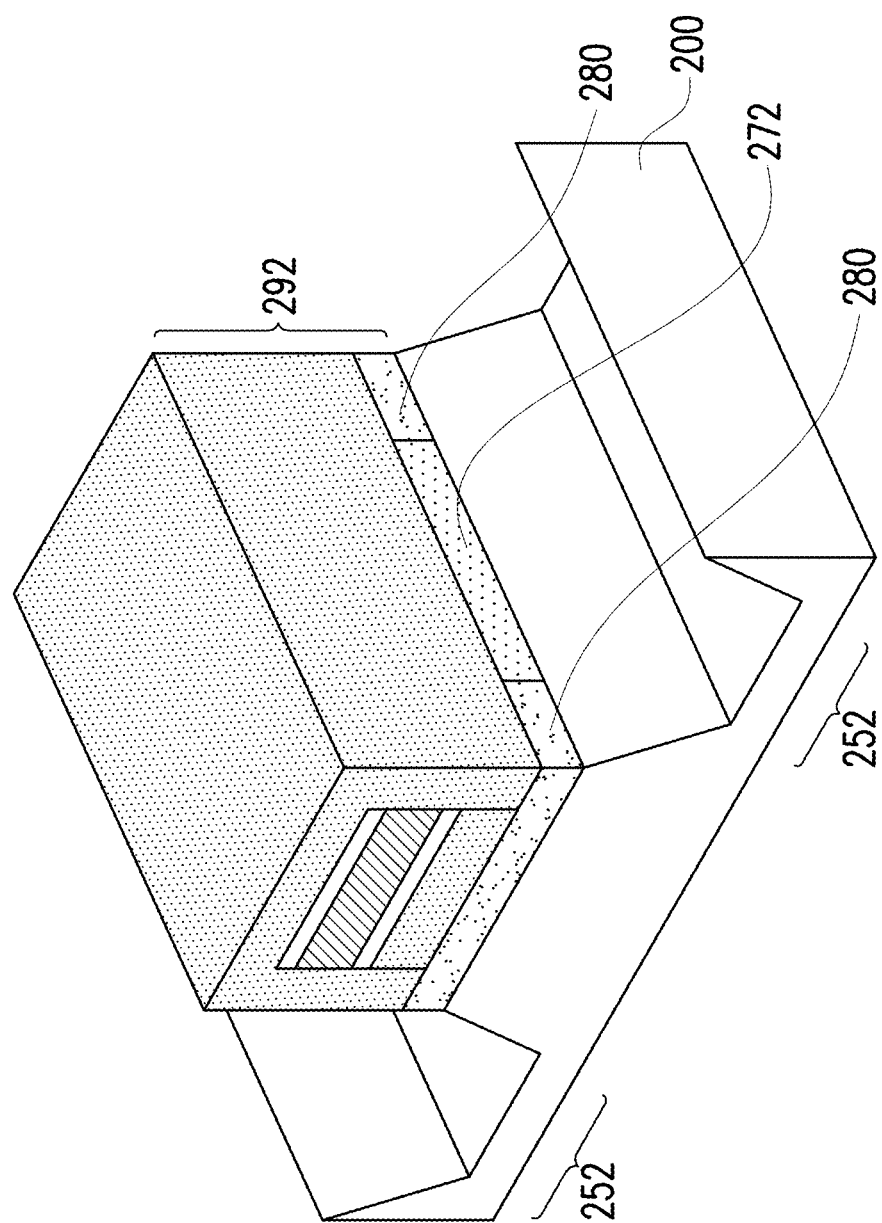
FIG. 7A and FIG. 7B illustrate additional steps that can be used in the method of FIG. 4, in accordance with some embodiments.
Figure 7B:
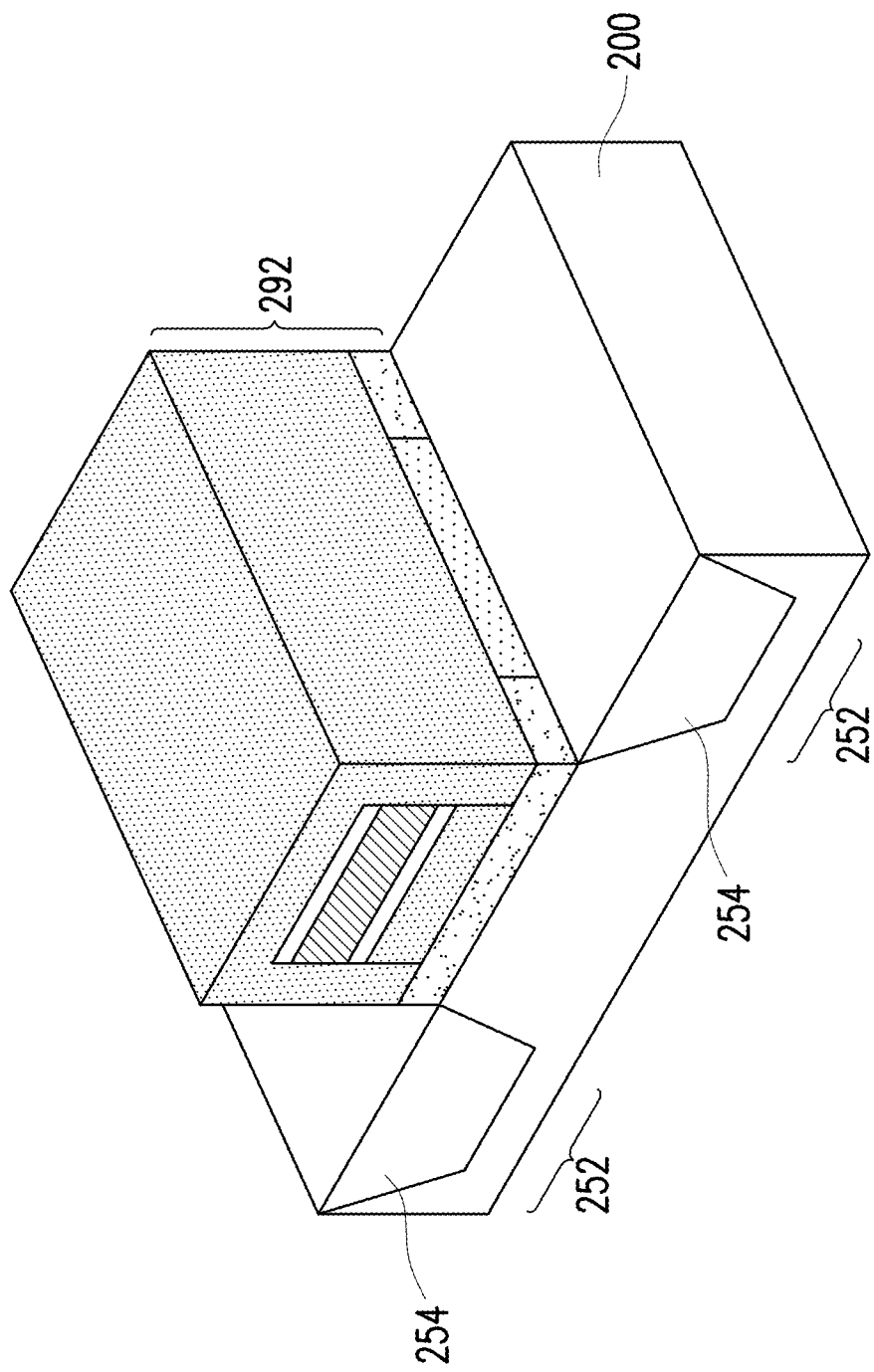

For example, as described in step 475 of FIG. 4, and as illustrated in FIG. 5I, etching is performed to remove the portions of the second gate dielectric layer that do not surround the fin 292, as well as the underlying portions of the first gate layer 272 and the first spacer layer 280. It is also contemplated that the etching may be continued into the substrate 200, as illustrated in FIG. 7A, to form trenches 252. Here, the substrate is illustrated as being thicker than the substrate in FIG. 5I. Next, as illustrated in FIG. 7B, the trenches are filled with a dielectric material to form shallow trench isolation (STI) regions 254 between adjacent fins. The dielectric material in the STI region is commonly silicon dioxide, although other dielectric materials can also be used such as undoped polysilicon, silicon oxide, silicon nitride, silicon oxynitride, fluoride-doped silicate glass, or other low-k dielectric material. The deposition can be done using physical vapor deposition (PVD) or chemical vapor deposition (CVD) or spin-on processes known in the art, or can be grown via oxidation. If desired, the dielectric material can be deposited to a level above that of the first gate layer, then recessed back down to the desired height by etching. It is contemplated that FIG. 7A and FIG. 7B would replace FIG. 5I, and could then be followed by step 480 and FIG. 5J.

Figure 8A:
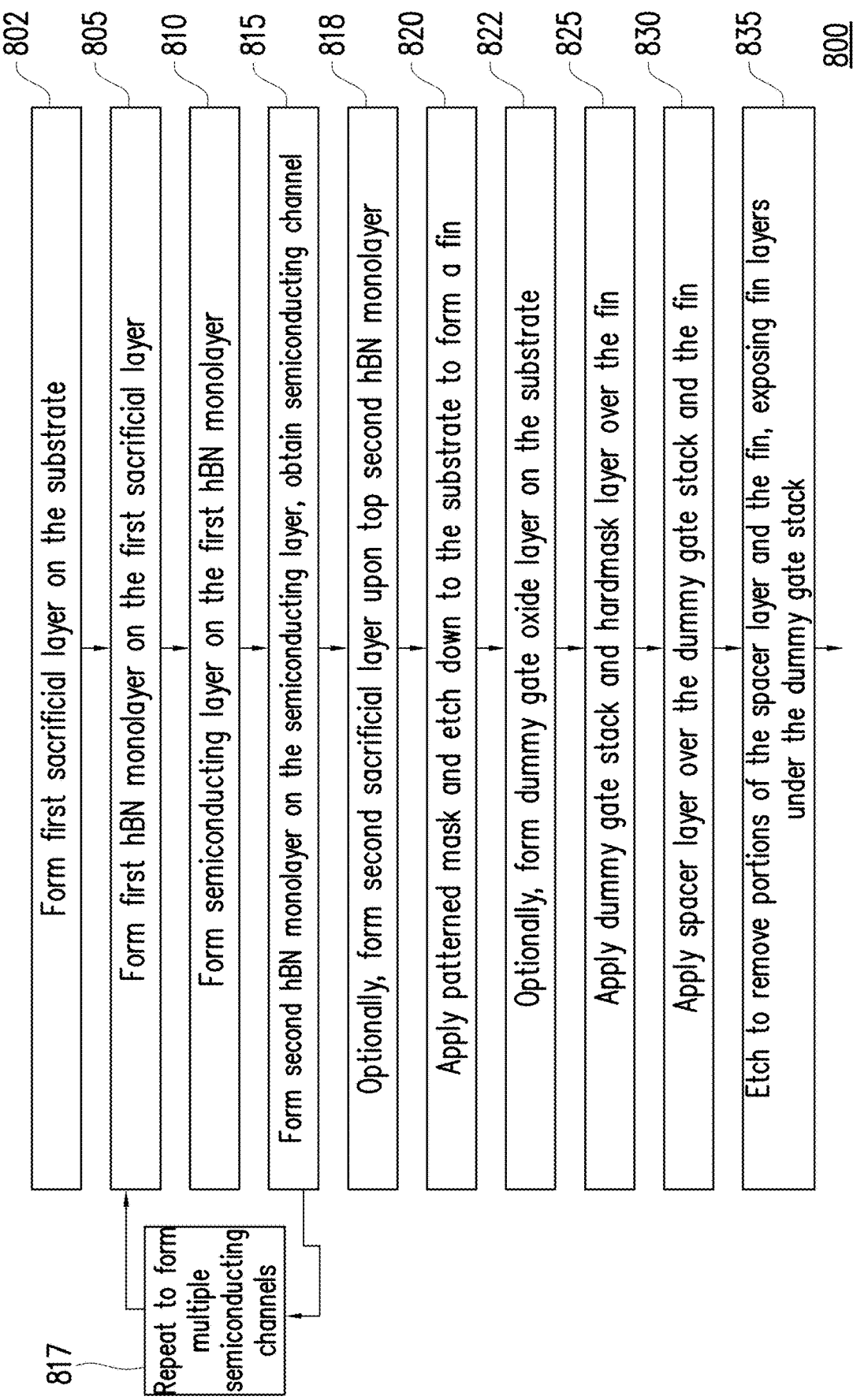
FIG. 8A and FIG. 8B together a flow chart illustrating a third method for making a gate-all-around (GAA) transistor with multiple semiconducting channels, in accordance with some embodiments.
Figure 8B:
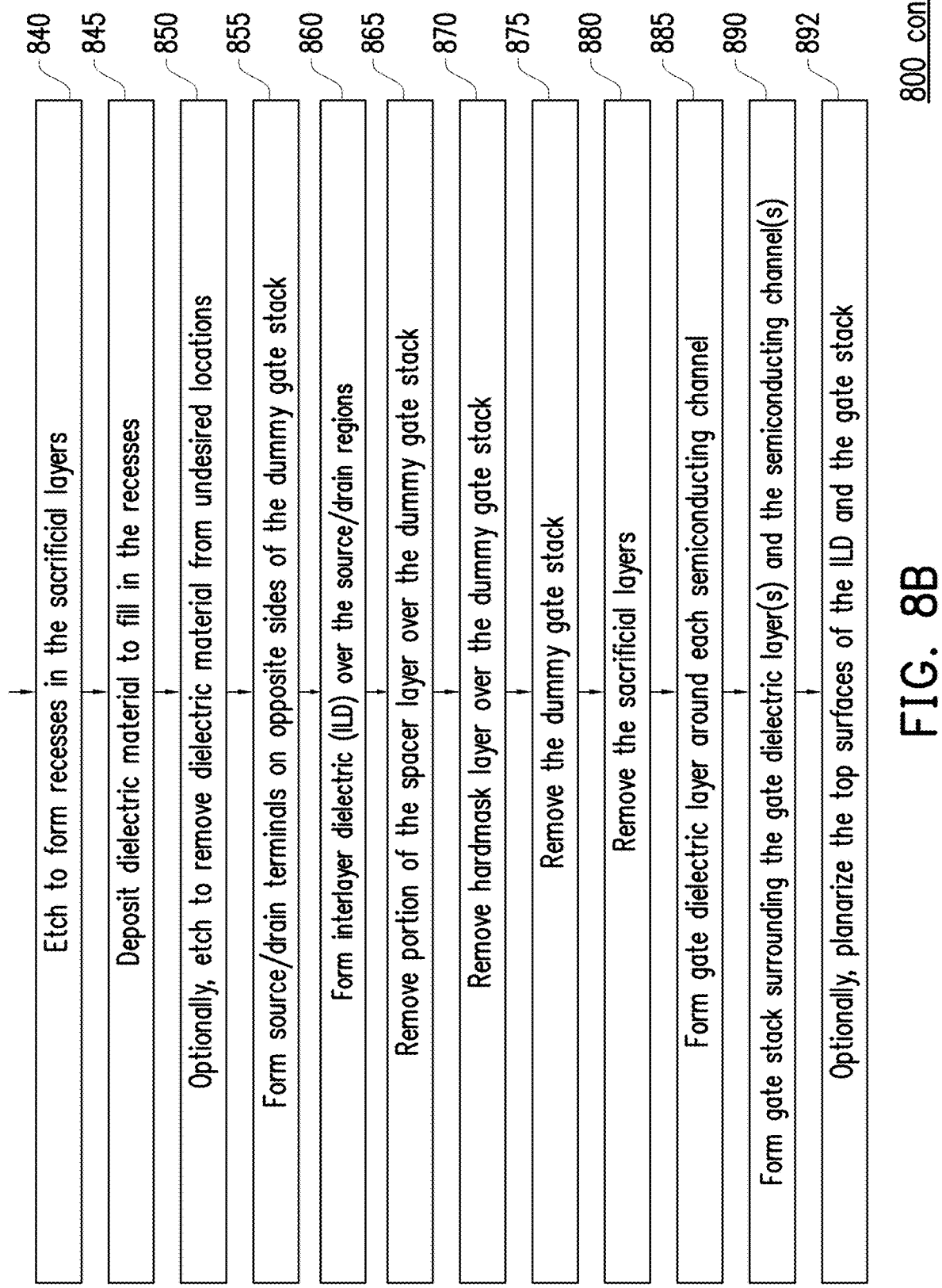
Figure 9A:
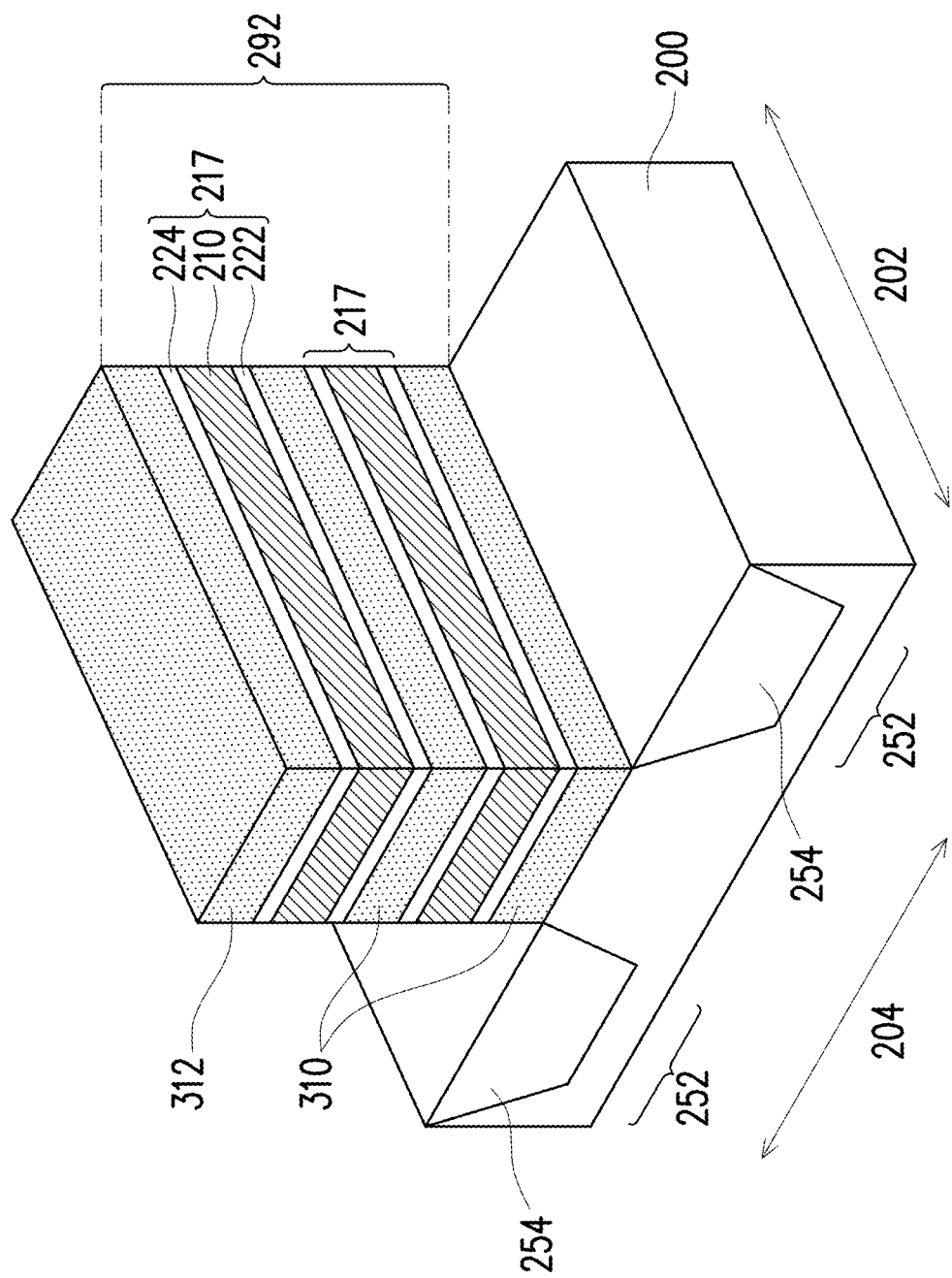
FIGS. 9A-9V illustrate various cross-sectional views of intermediate stages for forming the transistor as described in FIG. 8A and FIG. 8B.
Figure 9B:
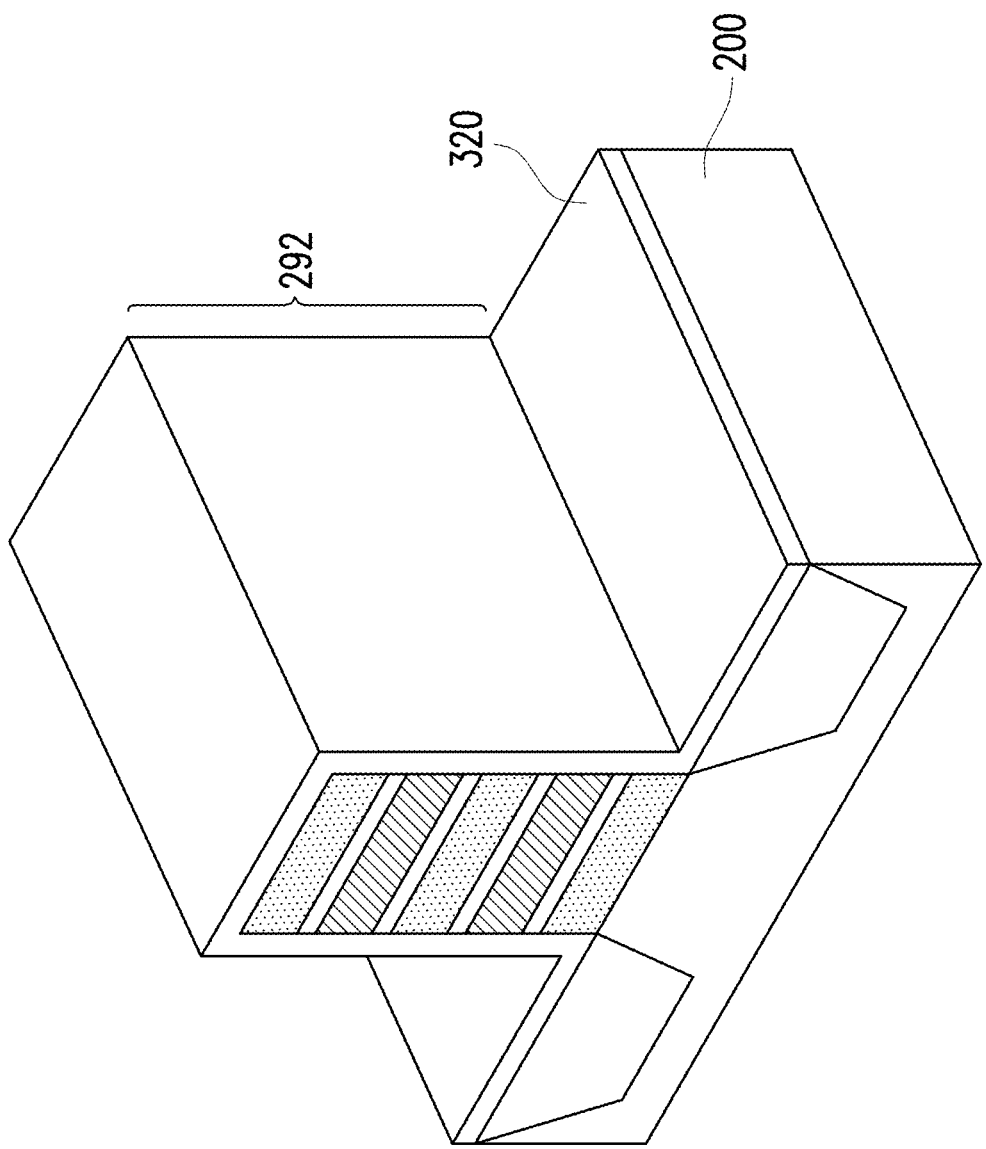
Figure 9C:
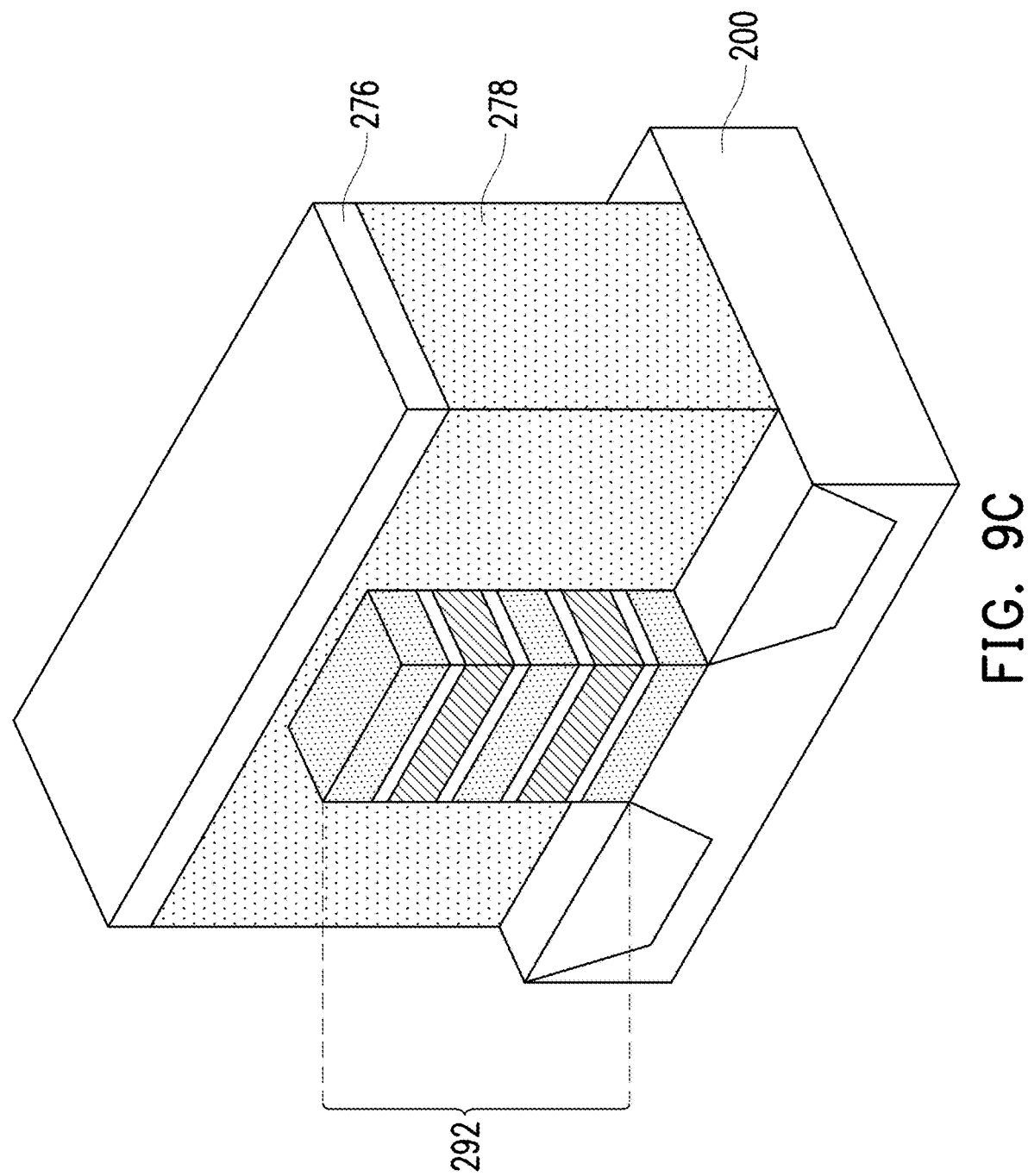
Figure 9D:
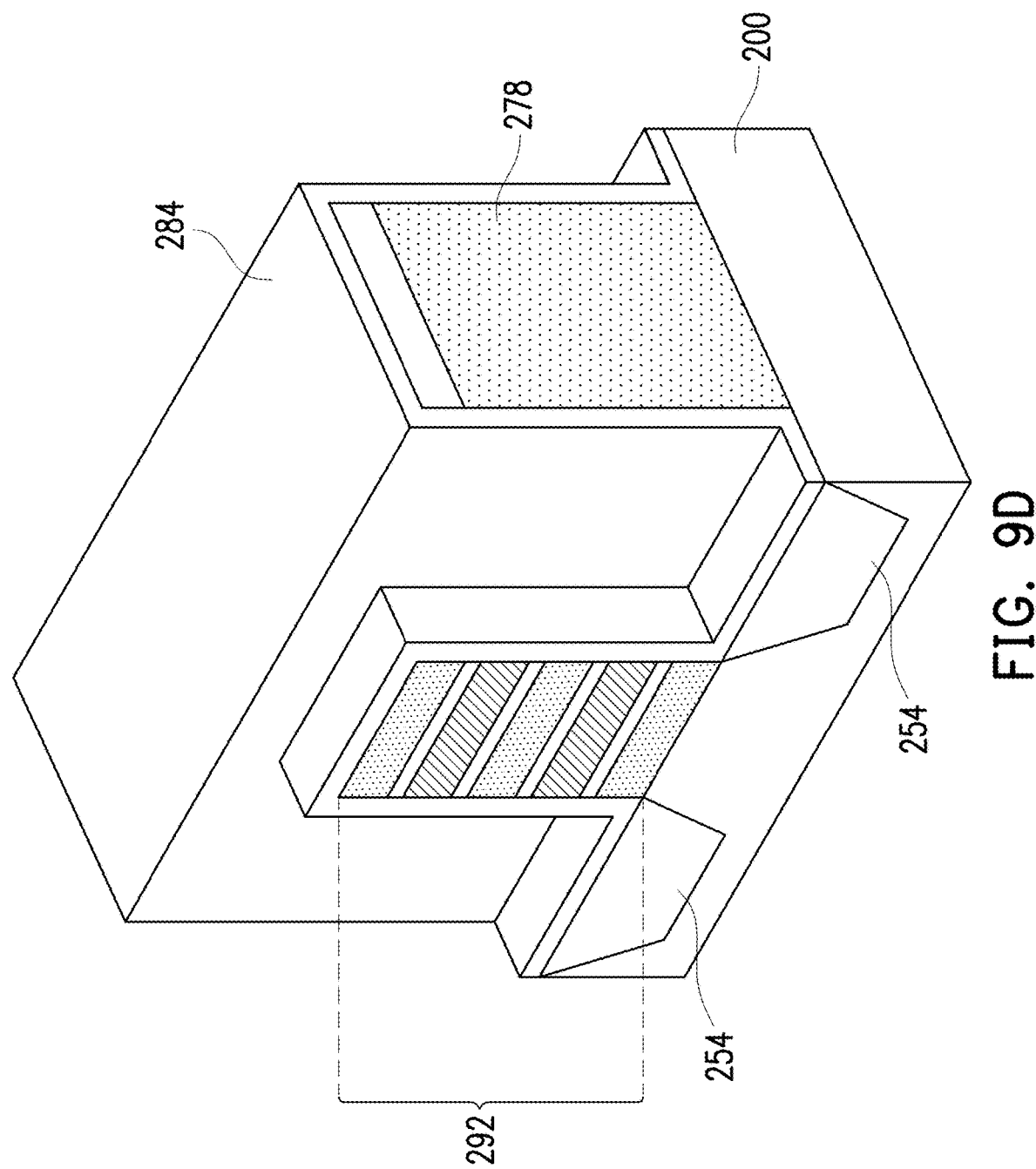

FIG. 8A and FIG. 8B together form a flow chart illustrating a third method 800 for making a transistor, in accordance with some embodiments. FIGS. 9A-9V illustrate various steps of the third method, and these figures are discussed together. These figures are illustrated with reference to a gate-all-around (GAA) transistor which can include one semiconducting channel or multiple semiconducting channels, in contrast to FIGS. 5A-5N which include only a single semiconducting channel. It is noted that several steps in the third method of FIG. 8A and FIG. 8B correspond to steps also taken in the second method of FIG. 4.

Referring now to FIG. 8A and FIG. 9A, in step 802, a first sacrificial layer 310 is formed upon the substrate. In step 805, a first hexagonal boron nitride (hBN) monolayer 222 is formed upon the first sacrificial layer 310. In step 810, a semiconducting layer 210 is formed upon the first hBN monolayer 222. In step 815, a second hBN monolayer 224 is formed upon the semiconducting layer 210. These layers can be made using CVD, ALD, MBE, LPE, VPE, by transferring from a different surface as previously described, or any other appropriate process.

Each combination of the first hBN monolayer 222, the semiconducting layer 210, and the second hBN monolayer 224 will eventually form a semiconducting channel, as will become more evident later. Steps 805-815 can be repeated to create as many semiconducting channels as desired, with a sacrificial layer between each semiconducting channel, indicated by step 817. Continuing, in optional step 818, a second sacrificial layer 312 is formed upon the top second hBN monolayer 224. The second sacrificial layer is not always necessary, as will be seen later. The first sacrificial layers 310 and the second sacrificial layer 312 can be made of any suitable material which can be selectively etched in comparison to the other materials that will be used in the transistor, such as for example SiGe.

Next, a photoresist layer is applied to the top second hBN monolayer and patterned to form a mask. Then, in step 820, etching is performed through the mask down to the substrate. The photoresist layer is then removed.

Referring now to the perspective view of FIG. 9A, in essence, a fin 292 is formed after these steps. Two semiconducting channels 217 are illustrated here, each formed from a combination of a first hBN monolayer 222, a semiconducting layer 210, and a second hBN monolayer 224. However, any number of semiconducting channels can be made using this method. In addition, the STI regions 254 in the substrate 200 which were described in FIG. 7A and FIG. 7B are also illustrated. Trenches 252 are present on either side of the fin 292. FIG. 9A is also marked with a lateral direction 202 and a longitudinal direction 204.

Next, in optional step 822, a dummy gate oxide layer 320 is formed upon the substrate 200. This can be done using ALD, CVD, or other deposition processes. The dummy gate oxide layer 320 covers the horizontal surfaces and the vertical surfaces of the fin 292. Eventually, the dummy gate oxide layer is present only below a dummy gate stack and is removed from other surfaces. FIG. 9B illustrates the result after this optional step.

Continuing, in step 825, a dummy gate stack 278 is applied over the fin 292. The dummy gate stack may include a hardmask layer 276. The resulting structure is illustrated in FIG. 9C. It is noted that the optional dummy gate oxide layer is not illustrated in this figure or the following figures. However, after the hardmask layer 276 is applied, an etching step could be performed to remove the dummy gate oxide layer from the exposed surfaces not protected by the hardmask layer.

In subsequent step 830, a spacer layer 284 is applied over the dummy gate stack 278, the fin 292, and the STI regions 254. The resulting structure is illustrated in FIG. 9D.

Next, in step 835, the structure is anisotropically etched to remove portions of the spacer layer 284 and the fin 292. After the etching, as illustrated in FIG. 9D, the various layers of the fin 292 under the dummy gate stack 278 are exposed through the longitudinal surfaces of the spacer layer 284.

Figure 9E:
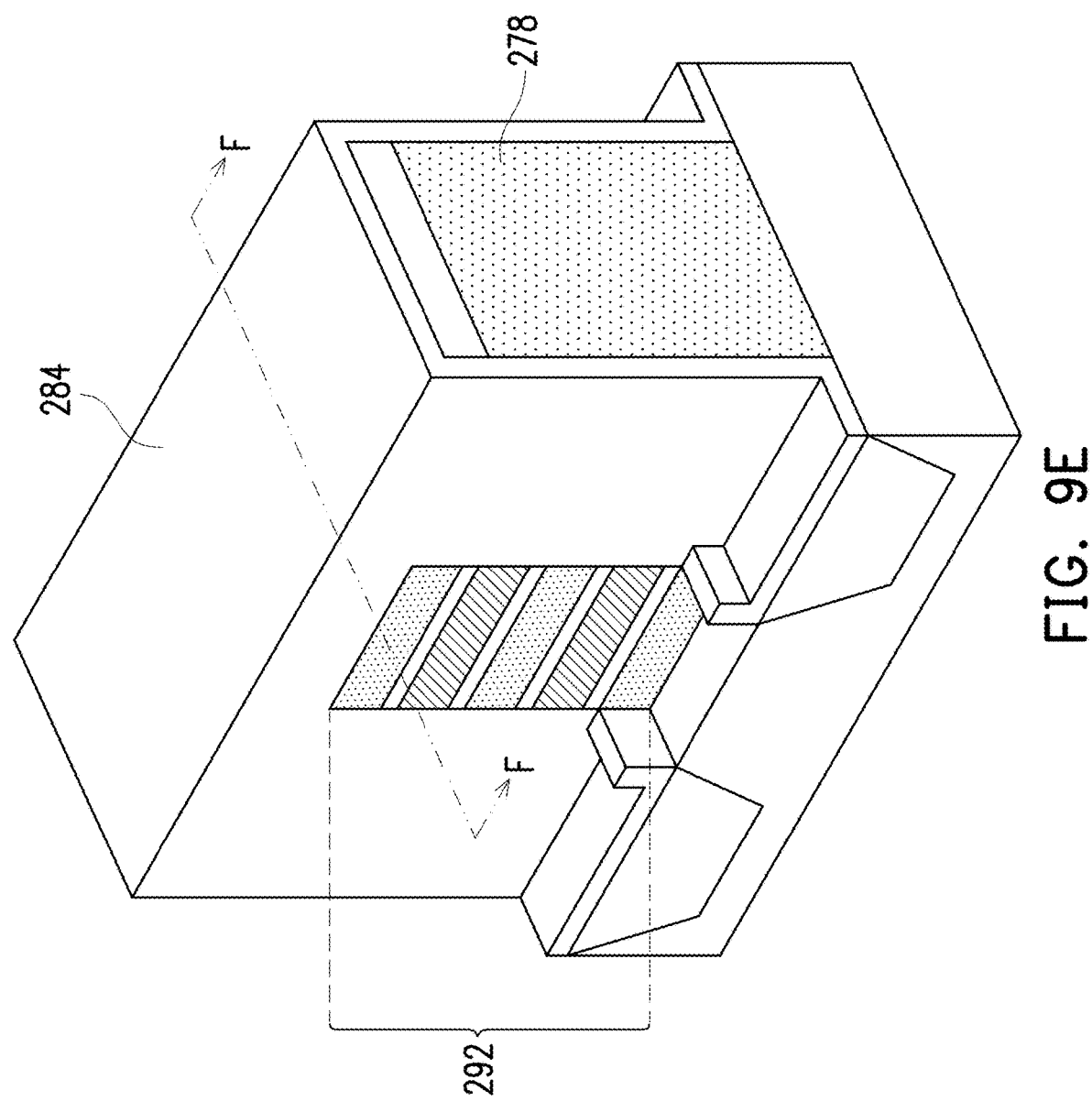
Figure 9G:
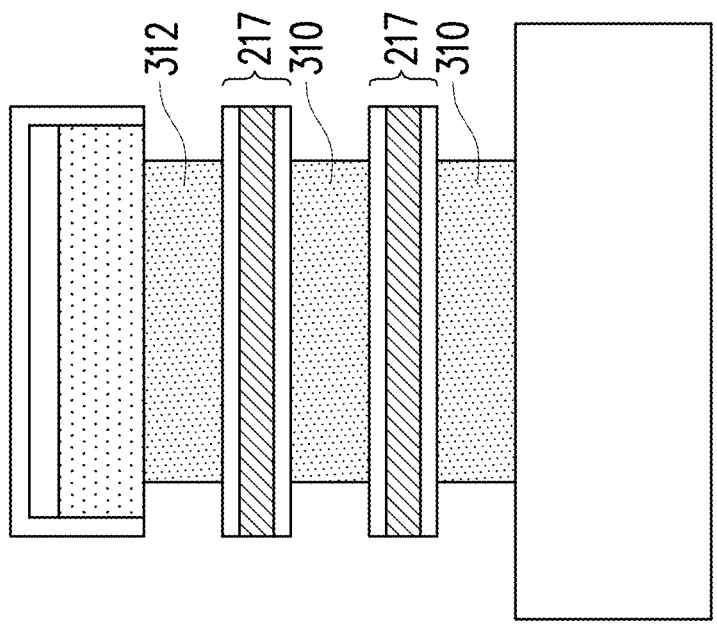
Figure 9F:
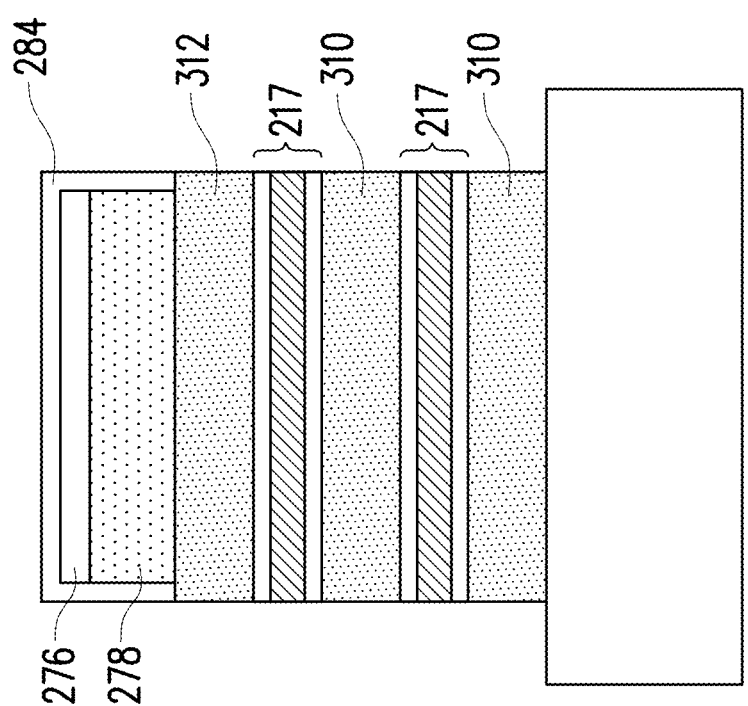
Figure 9I:
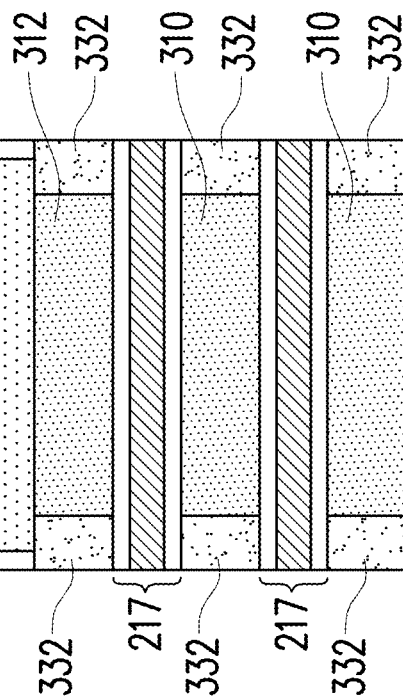

FIGS. 9F-9J are lateral cross-sectional views taken along line F-F in FIG. 9E. FIG. 9F is a view of the structure after step 835.

Continuing now with FIG. 8B, in step 840, an anisotropic etching process is used to form recesses in the exposed portions of the first sacrificial layers 310 and the second sacrificial layer 312. The resulting structure is illustrated in FIG. 9G.

Figure 9H:
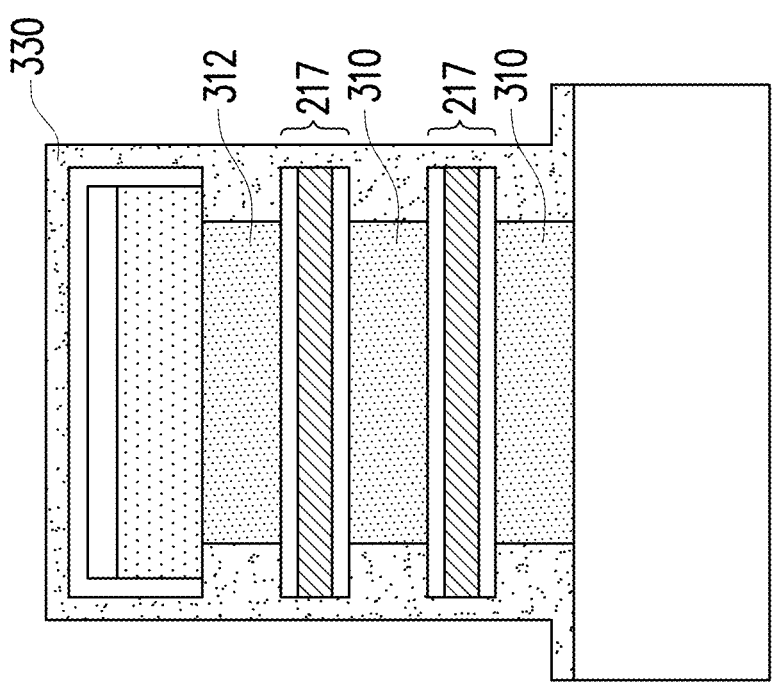

In following step 845, referring to FIG. 9H, a dielectric material 330 is formed to fill in the recessed portions of the first sacrificial layers 310. The dielectric material can be a low-k or high-k dielectric material, as desired, and may be formed by any suitable deposition process, such as ALD.

In optional step 850, referring to FIG. 9I, anisotropic etching may be performed to remove the deposited dielectric material 330 from undesired locations. As a result, the dielectric material 330 is present only in the recessed portions of the first sacrificial layers 310. After this step, the remaining portions of the dielectric material may be considered to be inner spacers 332, which will isolate the gate stack from source/drain regions formed in subsequent processing steps.

Figure 9J:
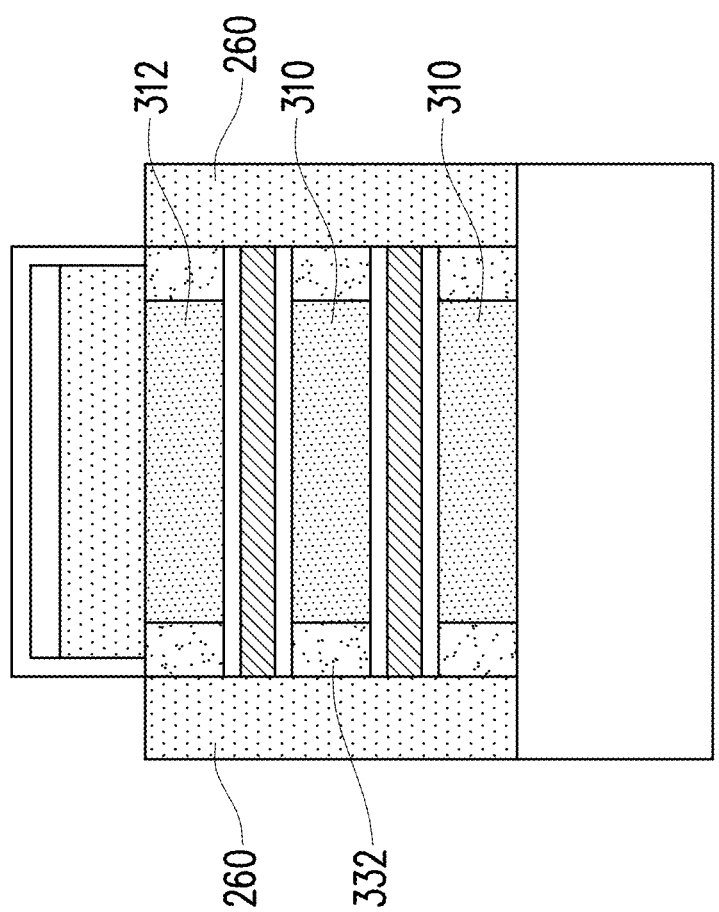
Figure 9K:
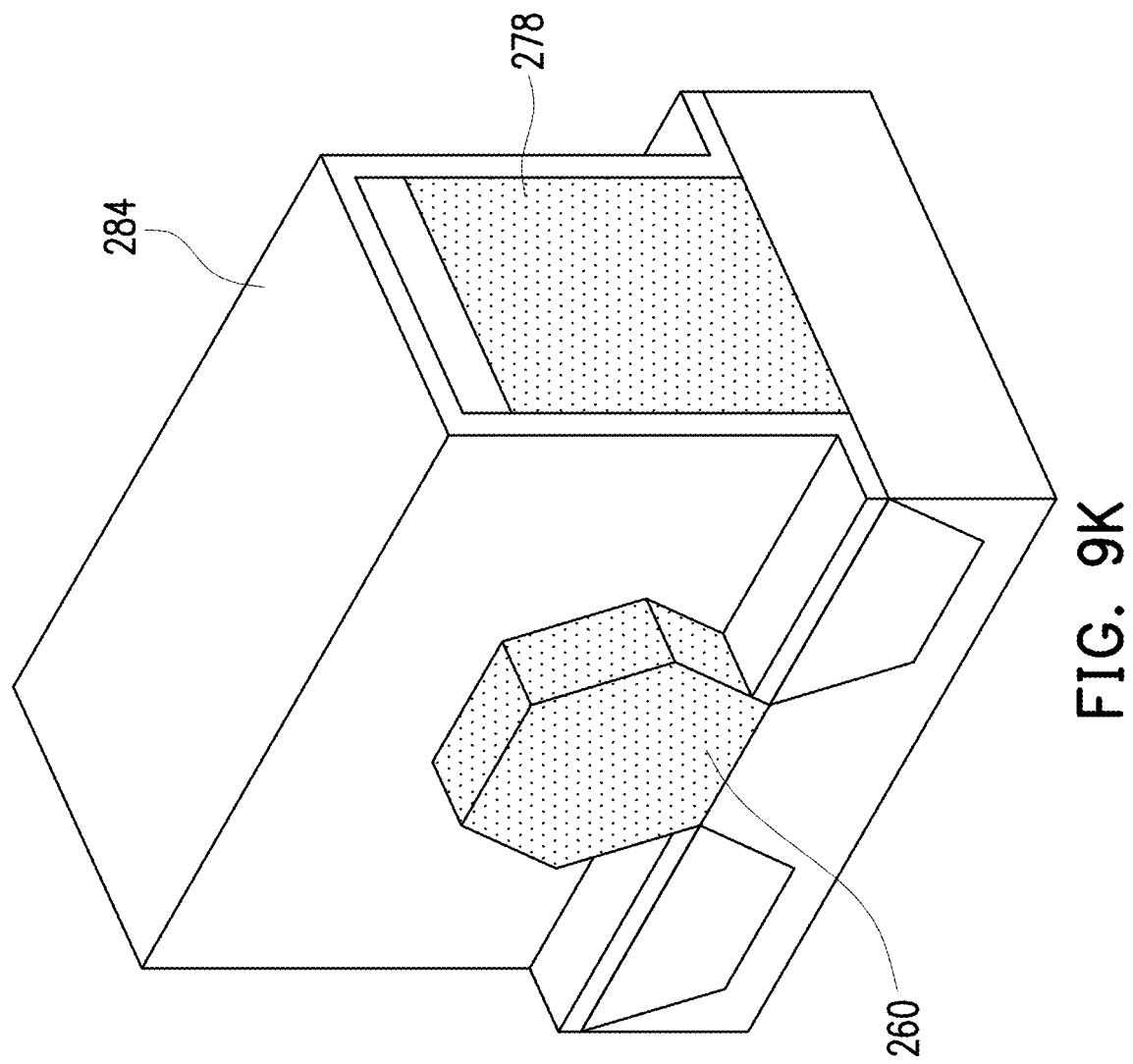

Next, in step 855, source/drain terminals 260 are formed on opposite sides of the dummy gate stack 278, adjacent to the exposed sides of the fin. FIG. 9J is a lateral cross-sectional view, and FIG. 9K is a perspective view after this step. The source/drain region is illustrated in FIG. 9K as a hexagon (can be any desired shape). The source/drain terminals 260 are separated from the dummy gate stack 278 by the spacer layer 284.

Subsequently, in step 860, an interlayer dielectric (ILD) 300 is formed over the source/drain regions 262. The resulting structure is shown in FIG. 9L.

Figure 9L:
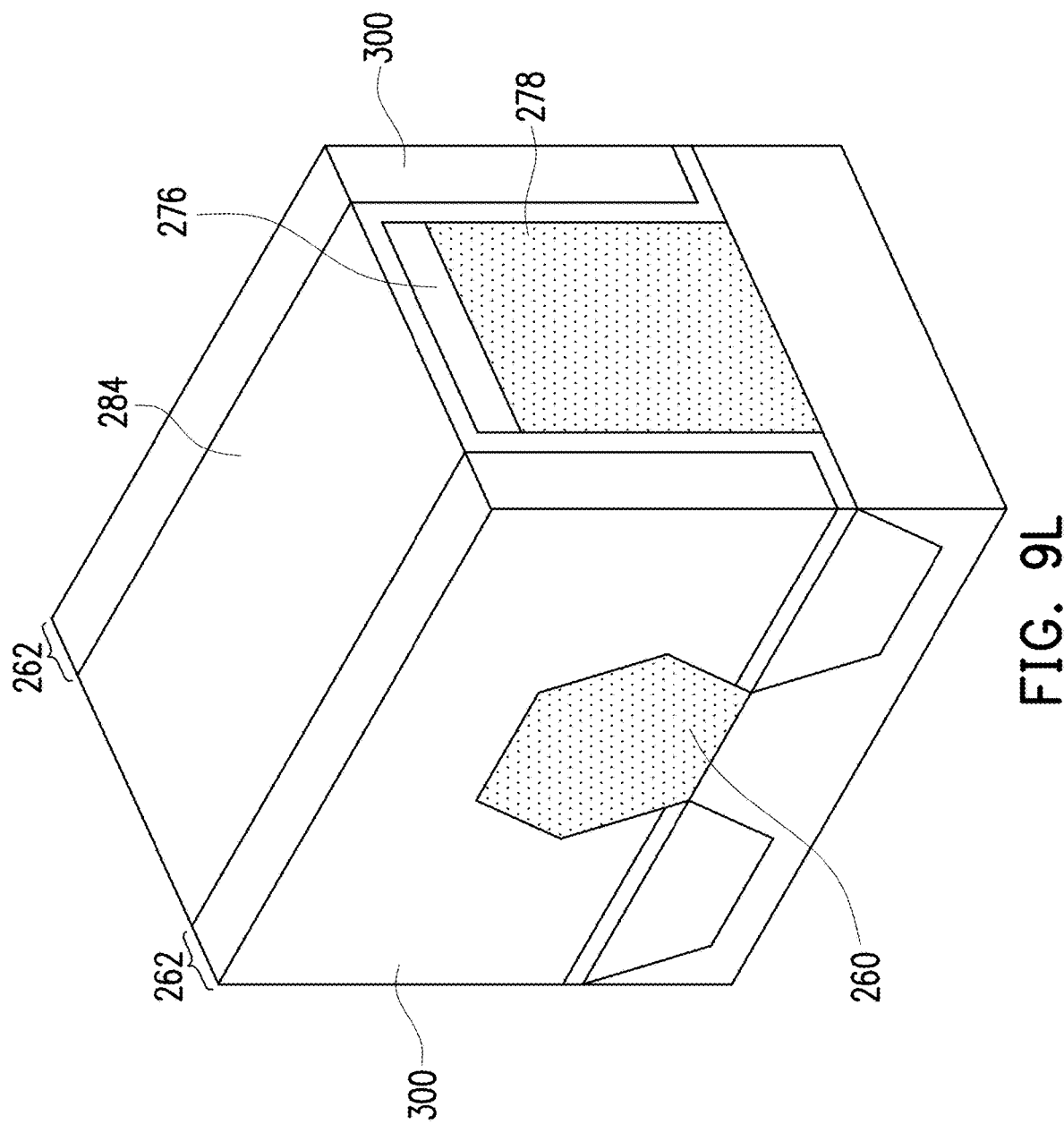
Figure 9M:
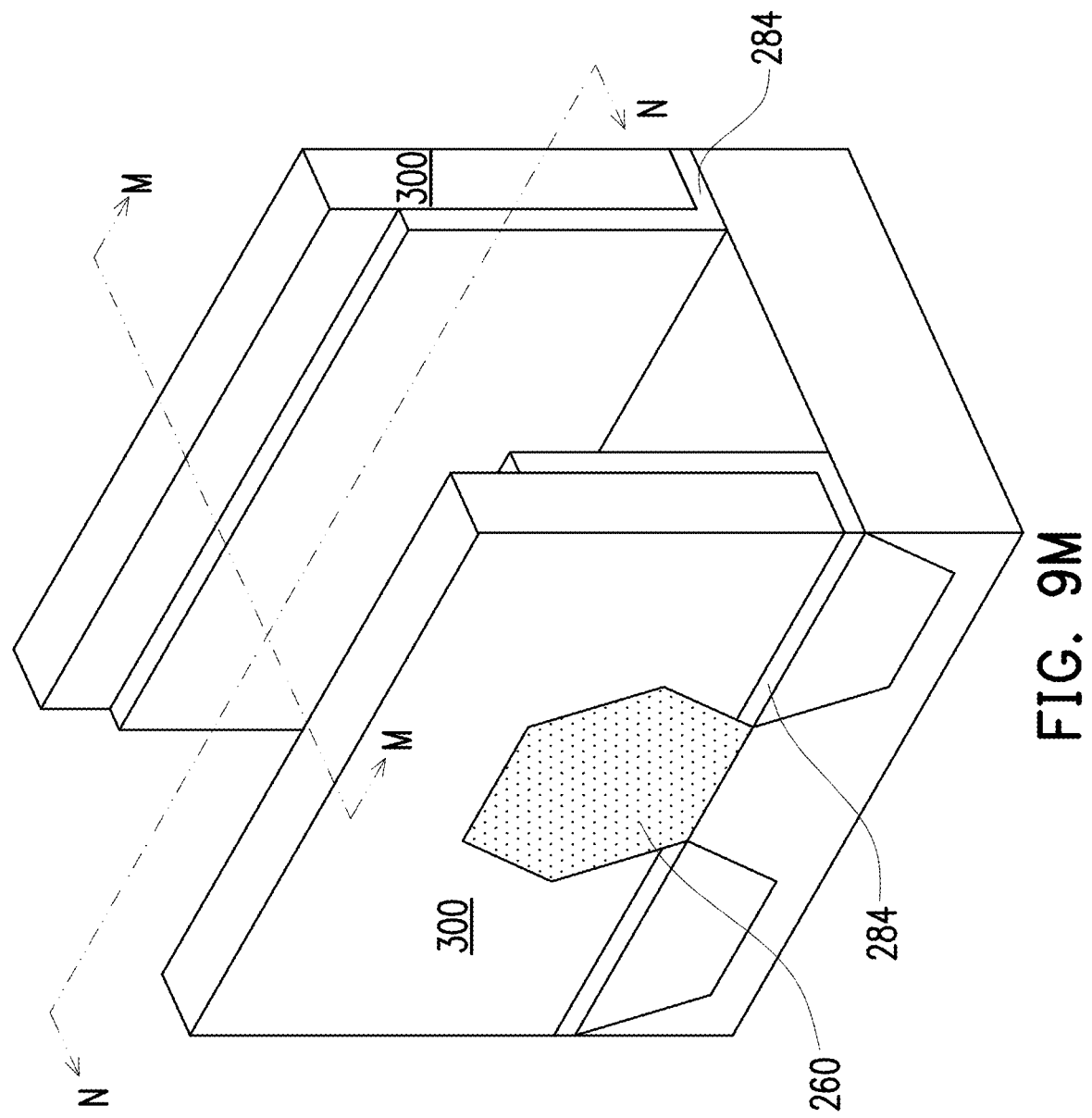

It is noted that in FIG. 9L, a horizontal portion of the spacer layer 284 covers the dummy gate stack 278. In step 865, that horizontal portion of the spacer layer 284 is removed from above the dummy gate stack 278. In step 870, the hardmask layer 276 is removed from above the dummy gate stack 278. In step 875, the dummy gate stack 278 is removed. The resulting structure is shown in FIG. 9M in a perspective view. These steps can be performed by wet etching, dry etching, or CMP as desired or appropriate. If the optional dummy gate oxide layer 320 is present, it can be used as an etch stop layer for the other layers, and then itself etched and removed.

FIG. 9N, FIG. 9P, FIG. 9R, and FIG. 9T are lateral cross-sectional views along line M-M of FIG. 9M. FIG. 9O, FIG. 9Q, FIG. 9S, and FIG. 9U are longitudinal cross-sectional views along line N-N of FIG. 9M.

Figure 9O:
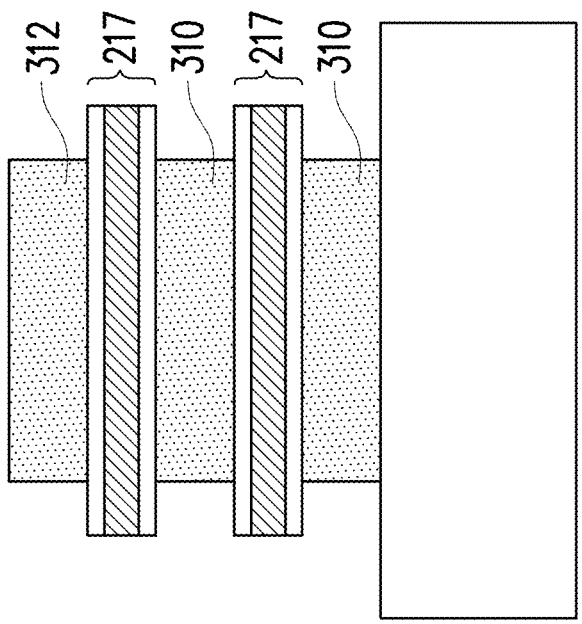
Figure 9N:
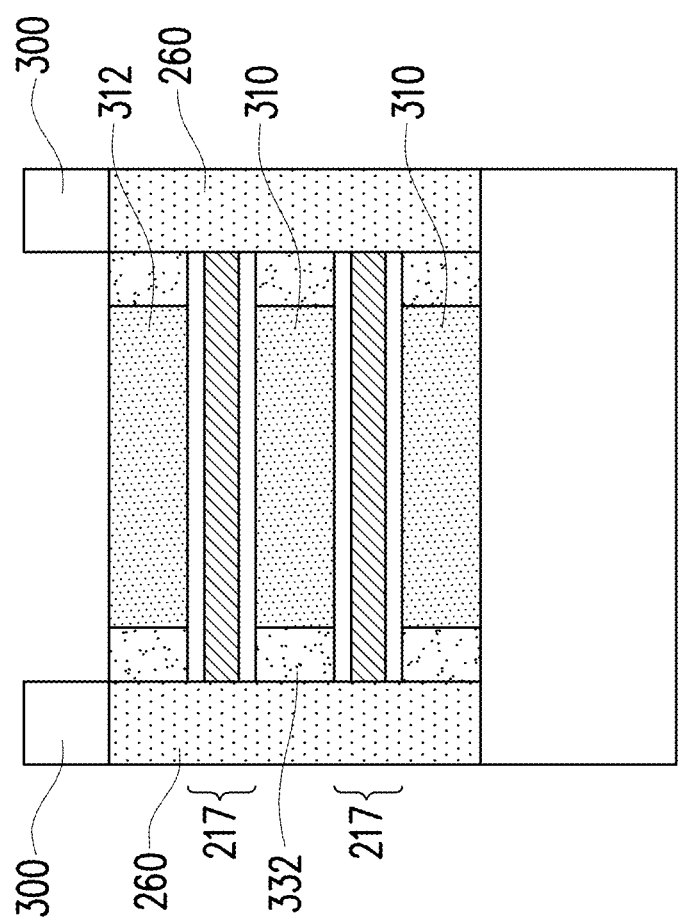

FIG. 9N and FIG. 9O show the resulting structure after step 875. The two semiconducting channels 217 are located between the first sacrificial layers 310 and the second sacrificial layer 312.

Figure 9Q:
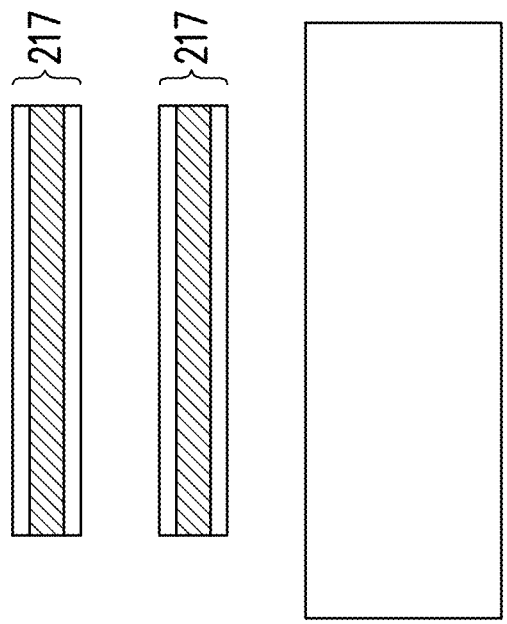
Figure 9P:
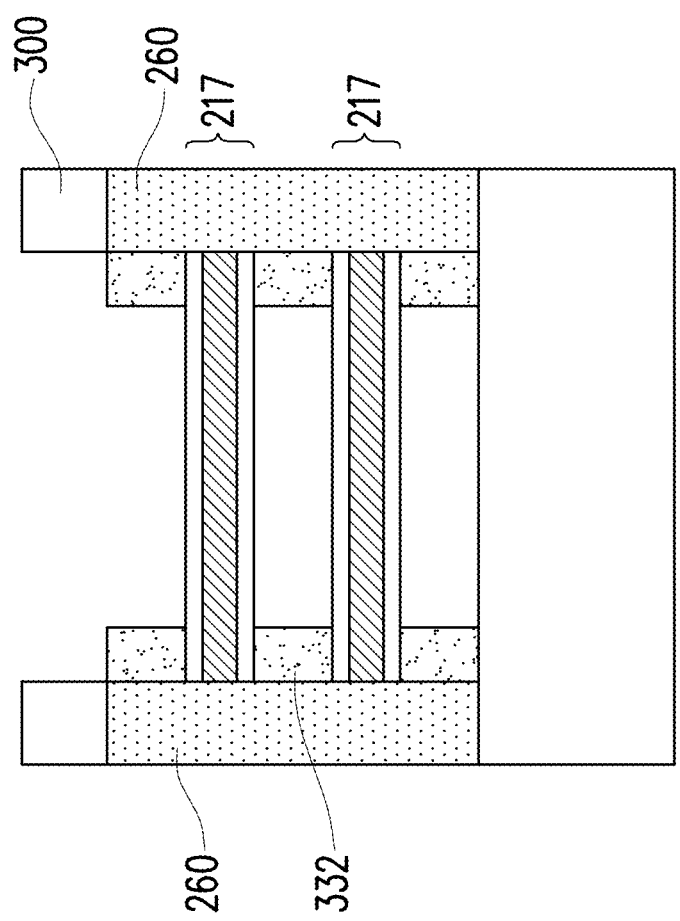

Continuing with FIG. 8B, in step 880, the first sacrificial layers 310 and the second sacrificial layer 312 are removed. The resulting structure is shown in FIG. 9P and FIG. 9Q. Please note that the middle of semiconducting channels 217 are suspended in FIG. 9Q, and the semiconducting channels are supported at their ends, as seen in FIG. 9P.

With the removal of the first sacrificial layers 310 and the second sacrificial layer 312, the hBN monolayers 222, 224 are exposed. It is noted that if the second sacrificial layer 312 was not present, the top second hBN monolayer 224 would have become exposed after step 875, and would have been exposed in FIG. 9N and FIG. 9O. Thus, as previously mentioned, the use of a second sacrificial layer 312 is optional.

Figure 9S:
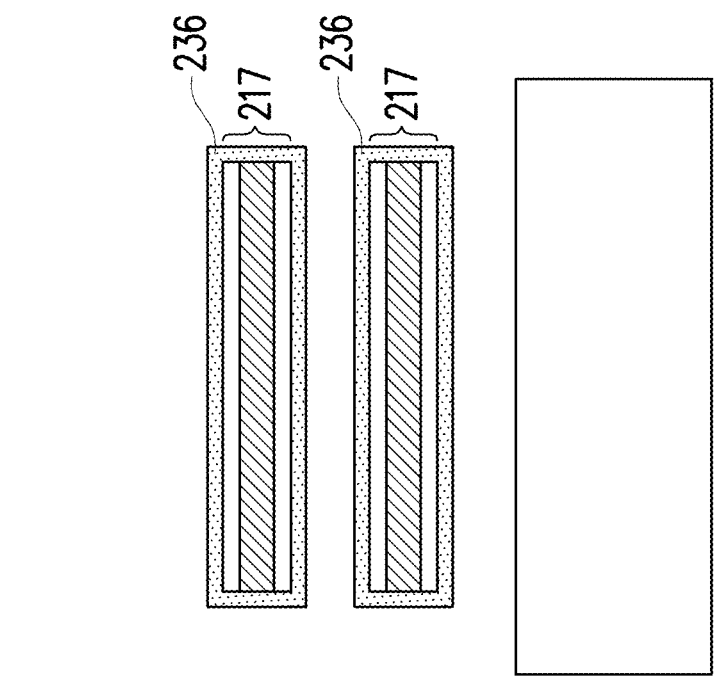
Figure 9R:
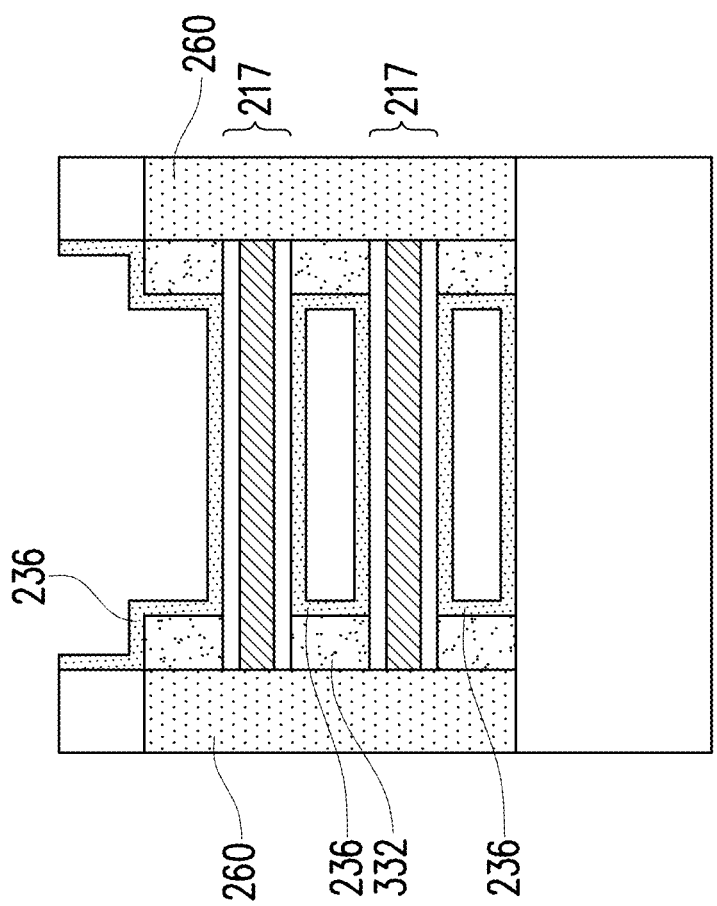

Next, in step 885, a gate dielectric layer 236 is formed around each semiconducting channel 217. The gate dielectric layer can be made of any dielectric material, and may also be a high-k dielectric material as previously described. In some embodiments, this step is performed using a plasma-enhanced deposition process as previously described. In other embodiments, the semiconducting channels are pretreated with plasma, and an ALD or CVD deposition process is then used to form the gate dielectric layer. Again, some damage may occur to the lateral edges of the semiconducting channels due to the plasma treatment, but damage will not occur to the unexposed portions of the various semiconducting layers. The resulting structure is shown in FIG. 9R and FIG. 9S. It is noted that in FIG. 9R, the gate dielectric layer 236 is also present on the surfaces of the inner spacers 332 and the ILD 300, which are also dielectric materials, and thus this deposition is acceptable.

Figure 9U:
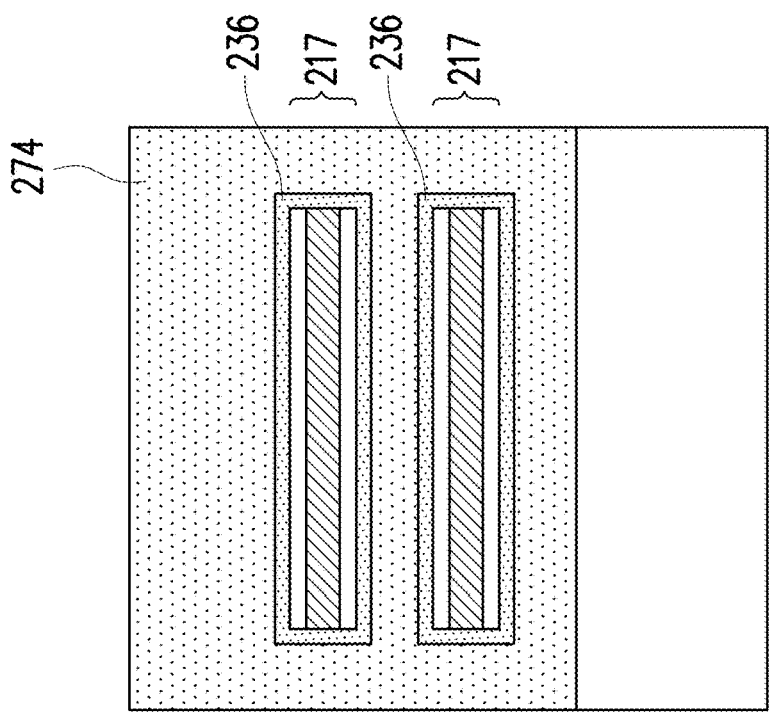
Figure 9T:
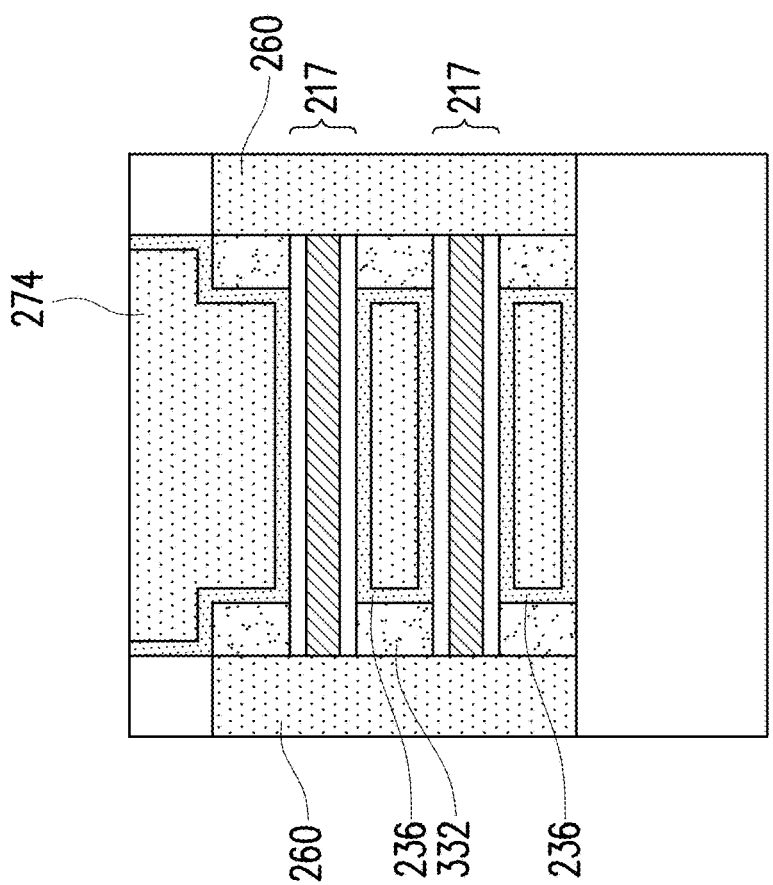
Figure 9V:
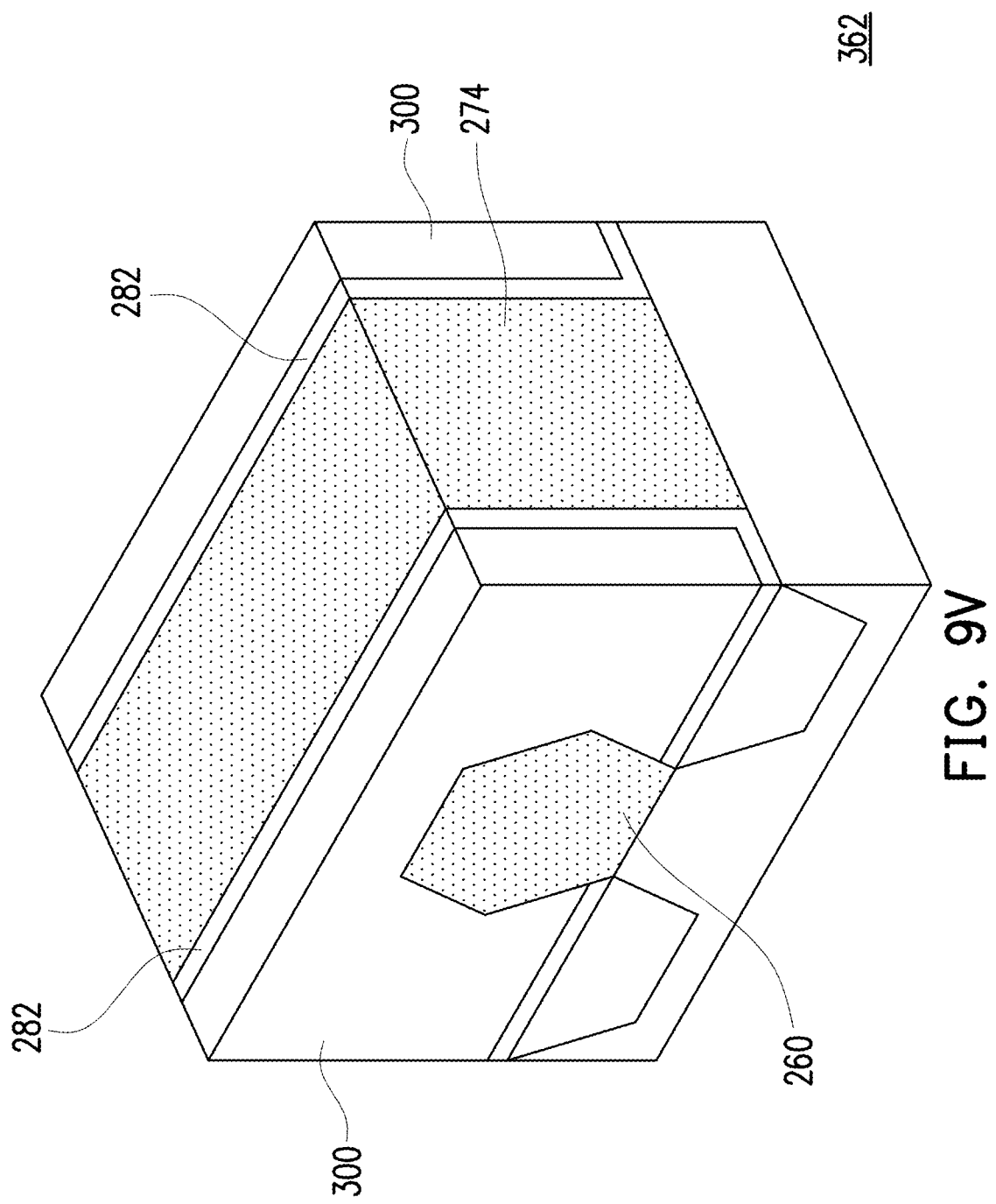

Next, in step 890, a gate stack 274 is formed upon the substrate in the space previously taken up by the dummy gate stack. The gate stack surrounds the gate dielectric layers 236 and the semiconducting channel 217. The gate stack 274 is located between the spacer layer 284 and the source/drain terminals 260, and forms the gate terminal. The gate stack can be a multi-layered structure to tune the properties of the gate terminal as desired. The gate stack can be formed using ALD, CVD, sputtering, or the like. The resulting structure is shown in FIG. 9T and FIG. 9U. As can be seen in these figures, the gate material fills the remaining spaces around the semiconducting channels 217 and the gate dielectric layers 232, 234.

If desired, in optional step 892, the top surface of the ILDs 300 and the gate stack 274 can be planarized to remove excess material. The resulting gate-all-around transistor 362 is shown in perspective view in FIG. 9V, and contains multiple semiconducting channels.

The methods of the present disclosure permit the production of very thin high-k dielectric layers on a very thin semiconducting layer or monolayer. A semiconducting monolayer permits the overall transistor to be very thin without the generation of surface dangling bonds, which is promising for gate control.

For comparison, atomic layer deposition (ALD) has traditionally been used to obtain an ultrathin high-k dielectric layer. Water is commonly used as a precursor or reactant in ALD at high temperatures of 200° C. to 400° C. for oxidation. Because monolayer semiconducting materials tend to be less stable than bulk materials, water exposure at these high temperatures tend to damage the semiconducting monolayer. Low-temperature (below 200° C.) nucleation processes have been used to produce ultrathin high-k dielectric layers. However, low temperatures may be inadequate for the precursor to decompose sufficiently, resulting in fixed charges on the dielectric layer and a degraded dielectric constant. Deposition of a seed layer is another way to produce an ultrathin high-k dielectric layer. However, the seed layer usually has a low dielectric constant, which will limit the ultimate capacitance of the transistor.

The use of the hBN monolayer permits the use of plasma processes for depositing the gate dielectric layer, protecting the very thin semiconducting layer from damage that might otherwise be caused by the plasma. The use of the hBN monolayer is also believed to aid in depinning, and to reduce charge scattering. hBN also has high thermal conductivity and can aid in heat dissipation. Again, while hBN monolayers are described above as being part of a semiconducting channel, they may alternatively being considered as a layer of a multi-layer gate dielectric.

Some embodiments of the present disclosure thus relate to methods for making a transistor. A semiconducting layer is formed on a substrate. A hexagonal boron nitride (hBN) monolayer is applied to the semiconducting layer. A gate dielectric layer is then formed upon the hBN monolayer, either by using a plasma-enhanced deposition process or by pretreating the hBN monolayer with plasma and then using a deposition process. A gate terminal is then formed upon the gate dielectric layer.

Other embodiments of the present disclosure also relate to methods for forming a gate-all-around transistor. A first gate layer is formed upon a substrate. A first spacer layer is then formed on opposite sides of the first gate layer upon the substrate. A first gate dielectric layer is formed upon the first gate layer and the first spacer layer. A first hexagonal boron nitride (hBN) monolayer is formed upon the first gate dielectric layer. A semiconducting layer is formed upon the first hBN monolayer. A second hBN monolayer is formed upon the semiconducting layer. Etching is performed through a patterned mask down to the first gate layer to form a fin. A second gate dielectric layer having three sides is formed over the first hBN monolayer, the semiconducting layer, and the second hBN monolayer. Etching is then performed through a patterned mask down to the substrate to form a stack of layers. A gate stack is applied over the stack of layers. A second spacer layer is applied over the gate stack and the stack of layers. Etching is performed to expose the stack of layers through longitudinal surfaces of the second spacer layer. Source/drain regions are formed, which contact the exposed stack of layers and which are separated from the gate stack by the second spacer layer. An interlayer dielectric is formed over the source/drain regions. The second spacer layer is then removed from over the gate stack to expose the gate stack.

Other methods for forming a gate-all-around transistor are also disclosed herein. A first sacrificial layer is formed upon a substrate. A first hexagonal boron nitride (hBN) monolayer is formed upon the first sacrificial layer. A semiconducting layer is formed upon the first hBN monolayer. A second hBN monolayer is formed upon the semiconducting layer to obtain a semiconducting channel. Etching is then performed through a patterned mask down to the substrate to form a fin. A dummy gate stack is applied over the fin. A spacer layer is applied over the dummy gate stack and the fin. Etching is performed to expose the fin through longitudinal surfaces of the spacer layer. Additional etching is done to form recesses in the first sacrificial layer. The recesses in the first sacrificial layer are filled with a dielectric material to form inner spacers. Source/drain terminals are formed which contact the exposed fin and which are separated from the dummy gate stack by the second spacer layer. An interlayer dielectric is formed over the source/drain terminals. The spacer layer over the dummy gate stack is removed, and the dummy gate stack is removed. The first sacrificial layer is removed. A gate dielectric layer is formed around the semiconducting channel. A gate stack is formed around the gate dielectric layer.

Finally, some other embodiments of the present disclosure relate to a top-gate transistor. The transistor includes a two-dimensional semiconducting layer upon a substrate. A hexagonal boron nitride (hBN) monolayer is present upon the semiconducting layer. A gate dielectric layer is separated from the semiconducting layer by the hBN monolayer. A gate terminal contacts the gate dielectric layer. A source terminal and a drain terminal are electrically connected to the semiconducting layer.

The methods, systems, and devices of the present disclosure are further illustrated in the following non-limiting working examples, it being understood that the examples are intended to be illustrative only and that the disclosure is not intended to be limited to the materials, conditions, process parameters and the like recited herein.

EXAMPLES

Example 1

A sapphire ($Al_2O_3$) substrate was provided. A semiconducting layer of tungsten disulfide ($WS_2$) was applied to the substrate. An hBN monolayer was applied over the $WS_2$ layer. Raman spectra and photoluminescence (PL) spectra were obtained of this three-layer structure (hBN/$WS_2$/sapphire).

Then, a hafnium oxynitride (HfON) layer was applied over the hBN monolayer using plasma-enhanced ALD. The HfON layer had a thickness of about 5 nanometers. Raman spectra and photoluminescence (PL) spectra were obtained of this four-layer structure (HfON/hBN/$WS_2$/sapphire). These two structures are illustrated in FIG. 10A.

The two sets of Raman spectra and PL spectra were then compared to each other.

Figure 10B:
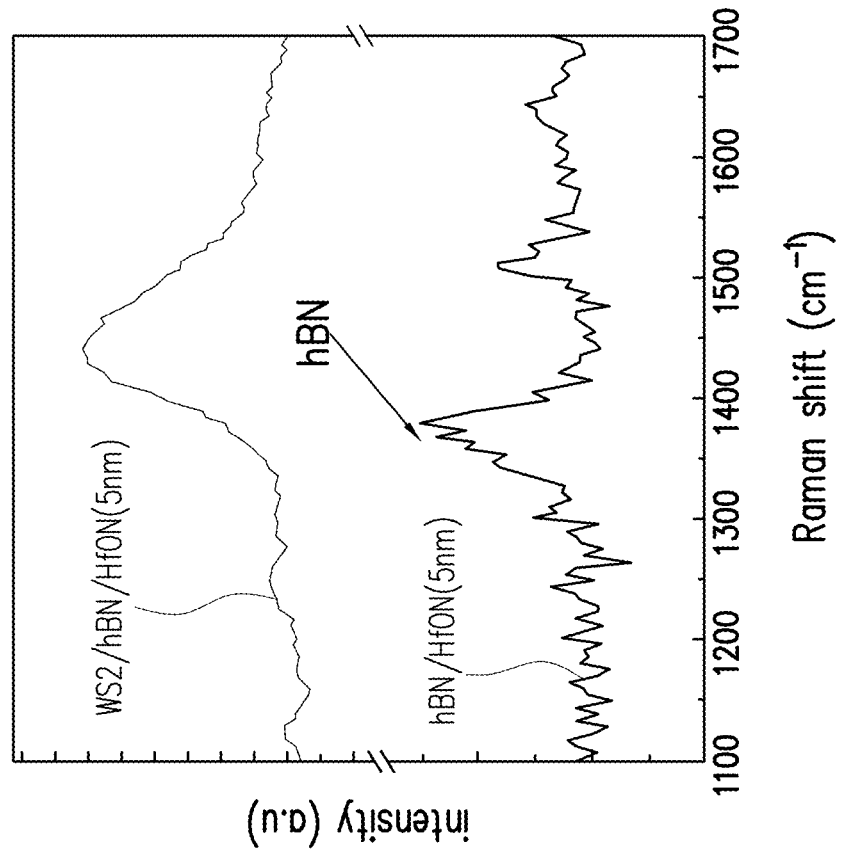
FIG. 10B is a first Raman spectrum comparing the two structures tested in Example 1.
Figure 10A:
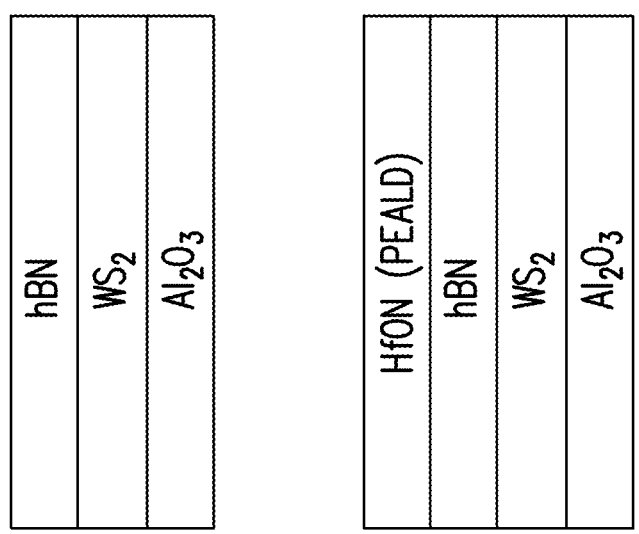
FIG. 10A is an illustration of two structures tested in Example 1.

FIG. 10B is a first Raman spectrum showing intensity versus Raman shift after the HfON layer is applied. This graph indicated that both the hBN and the $WS_2$ layers survived the PEALD process.

Figure 10D:
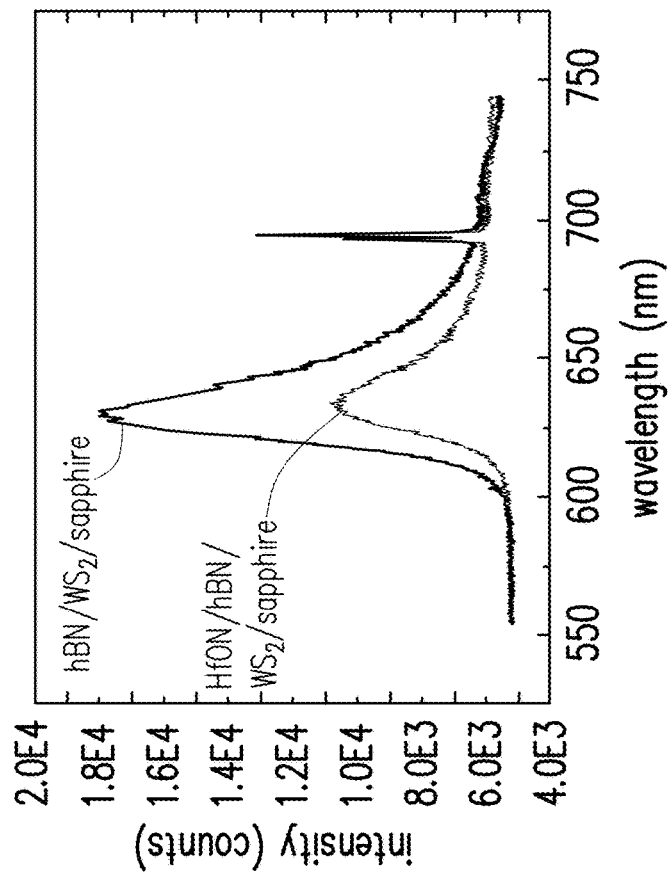
FIG. 10D is a photoluminescence (PL) spectrum of the two structures tested in Example 1.
Figure 10C:
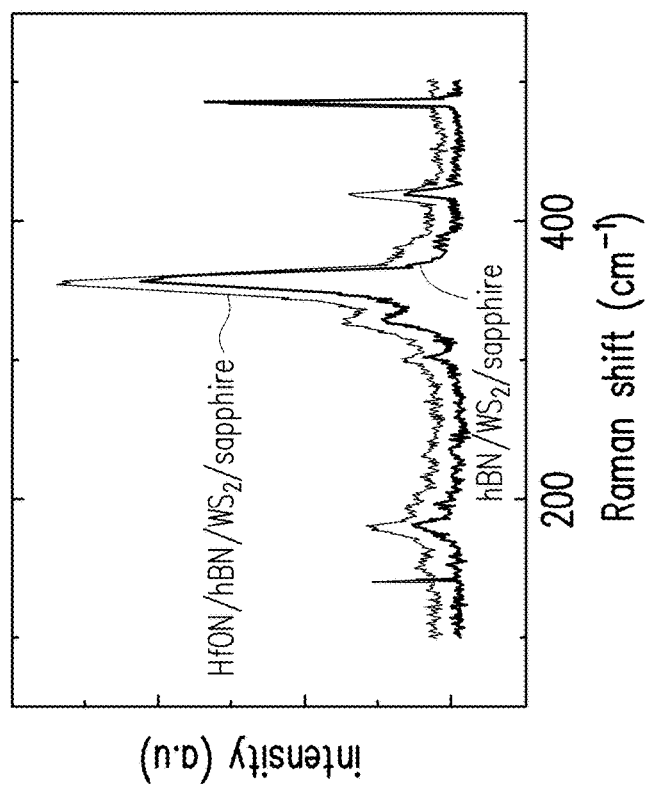
FIG. 10C is a second Raman spectrum comparing the two structures tested in Example 1.

FIG. 10C is a second Raman spectrum comparing the three-layer structure to the four-layer structure. The full width at half maximum (FWHM) of the three-layer structure (prior to HfON deposition) was 23.39 nm, and the FWHM of the four-layer structure (after HfON deposition) was 21.20 nm. The reduced FWHM indicated that the hBN and $WS_2$ layers were not damaged, and could potentially be considered more homogeneous.

FIG. 10D is the PL spectrum. This graph indicated that the PL peak shift was 1.24 nm, and no obvious doping effect was present (which might occur if the layers were damaged and their atoms were mixed together).

These results permitted the conclusion that hBN was an effective protecting layer for the $WS_2$ semiconducting layer.

Example 2

On a sapphire ($Al_2O_3$) substrate, an hBN monolayer was applied and an HfON layer of about 5 nm thickness was formed upon the hBN monolayer, to form a three-layer structure.

Figure 11:
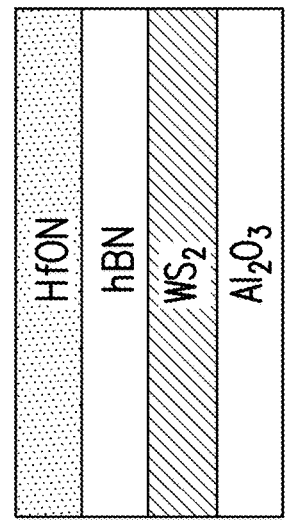
FIG. 11 is an illustration of two structures tested in Example 2.

Next, a semiconducting layer of $WS_2$ was applied to the substrate. An hBN monolayer was applied over the $WS_2$ layer. An HfON layer of about 5 nm thickness was then formed upon the hBN monolayer, to obtain a four-layer structure. The HfON layer was formed from 50 cycles of ALD. These two structures are illustrated in FIG. 11.

The step height and surface roughness (Ra) of these two structures were compared. The three-layer structure provides the total thickness of the hBN monolayer and the HfON layer, and the four-layer structure provides a measure of how well the dielectric HfON layer covers the semiconducting layer and the hBN monolayer. The step height should be the same as the thickness of the added $WS_2$ layer. The step height of the three-layer structure was 5.7 nm, and the step height of the four-layer structure was 0.88 nm greater, which corresponded relatively well to the expected height of a $WS_2$ monolayer (0.6-0.9 nm).

The Ra of the three-layer structure was 0.20 nm, and the Ra of the four-layer structure was 0.155 nm. This indicated that the HfON film was very smooth, and was not affected by the presence of the $WS_2$ monolayer.

For additional comparison, another four-layer structure was prepared, but using only 20 cycles of ALD for the HfON layer. The Ra was 0.347 nm. This suggests that the HfON layer could be reduced to a thickness of about 2 nm and still have a smooth film-like surface.

Example 3

A sapphire ($Al_2O_3$) substrate was provided. A semiconducting layer of tungsten disulfide ($WS_2$) was applied to the substrate. An hBN monolayer was applied over the $WS_2$ layer. Raman spectra and photoluminescence (PL) spectra were obtained of this three-layer structure (hBN/$WS_2$/sapphire).

Next, an $HfO_2$ layer was then formed upon the hBN monolayer, to obtain a four-layer structure. The $HfO_2$ layer was formed from 50 cycles of ALD in the presence of an $O_2$ plasma at 250° C. These two structures are essentially the same as illustrated in FIG. 10A.

Raman spectra and photoluminescence (PL) spectra were for both structures, and compared to each other.

Figure 12B:
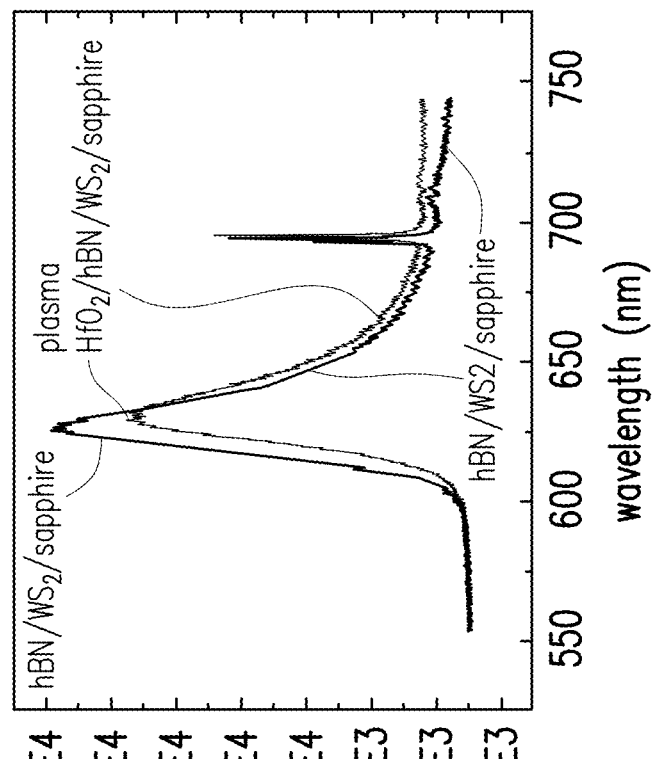
FIG. 12B is a PL spectrum of the two structures tested in Example 3.
Figure 12A:
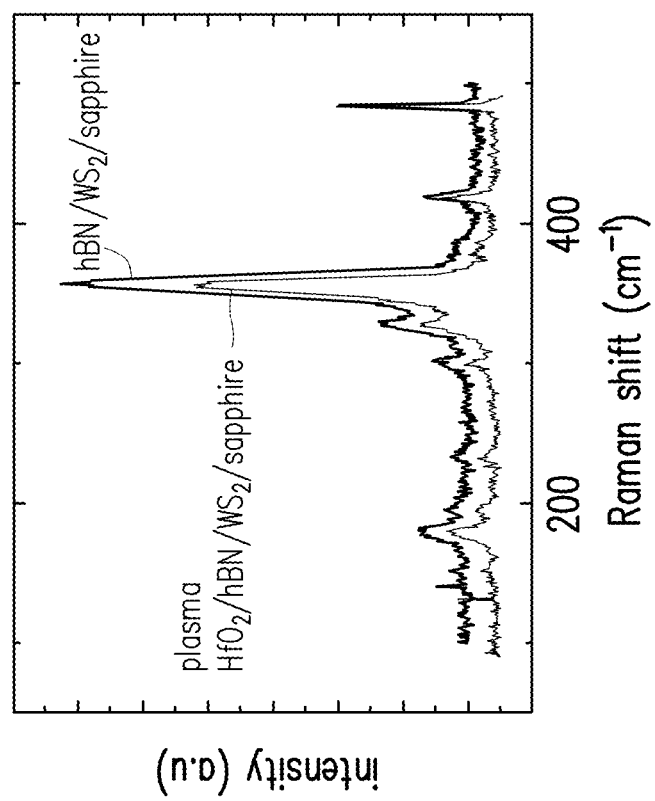
FIG. 12A is a Raman spectrum comparing the two structures tested in Example 3.

FIG. 12A is a Raman spectrum comparing the three-layer structure to the four-layer structure. The shapes of the two lines are the same, indicating no large differences between them. The FWHM of the three-layer structure (prior to $HfO_2$ deposition) was 27.77 nm, and the FWHM of the four-layer structure (after $HfO_2$ deposition) was 27.73 nm. This indicated that the hBN and $WS_2$ layers were not damaged by the plasma.

FIG. 12B is the PL spectrum. This graph indicated that the PL peak shift was 5.73 nm.

The surface roughness was also measured at 0.53 nm. This suggested that the wettability of $HfO_2$ was inferior to that of HfON, which has a lower Ra of 0.15 to 0.20 nm (as seen in Example 2).

These results permitted the conclusion that hBN was an effective protecting layer for the $WS_2$ semiconducting layer.

Example 4

Multiple structures were made. All structures included a $WS_2$ semiconducting monolayer. They varied in whether an hBN layer was present or not, whether a $HfO_2$ or HfON layer was formed, whether ALD or PEALD was used, and in the number of ALD cycles used to form the dielectric layer (larger number=thicker dielectric layer). The resulting thickness and surface roughness were measured, and whether the $WS_2$ layer was damaged. The combined thickness of of the hBN layer and the dielectric layer was measured.

Structure A had no hBN monolayer, and included an $HfO_2$ layer formed by 100 cycles of ALD.

Structure B had no hBN monolayer, and included an HfON layer formed by 100 cycles of PEALD.

Structure C had an hBN monolayer, and included an HfON layer formed by 50 cycles of PEALD.

Structure D had an hBN monolayer, and included an HfON layer formed by 30 cycles of PEALD.

Structure E had an hBN monolayer, and included an HfON layer formed by 15 cycles of PEALD.

Structure F had an hBN monolayer, and included an $HfO_2$ layer formed by 50 cycles of PEALD.

Structure G had an hBN monolayer formed from $NH_3$ plasma, and included an $HfO_2$ layer formed by 30 cycles of ALD.

Structure H had an hBN monolayer, an HfON layer upon the hBN monolayer formed from 5 cycles of PEALD, and an $HfO_2$ layer upon the HfON layer formed from 25 cycles of ALD.

Structure I had an hBN monolayer, an HfON layer upon the hBN monolayer formed from 10 cycles of PEALD, and an $HfO_2$ layer upon the HfON layer formed from 20 cycles of ALD.

Structure J had an hBN monolayer, and included an $HfO_2$ layer formed from 30 cycles of ALD.

Structure A is illustrated in FIG. 13A. Structure B is illustrated in FIG. 13B. Structures C-E are illustrated in FIG. 13C. Structure F is illustrated in FIG. 13D. Structures G and J are illustrated in FIG. 13E. Structures H and I are illustrated in FIG. 13F. Their measured results are shown in Table 1 below:

TABLE 1

| Structure | hBN present? | HfO2/ HfON | ALD/ PEALD | # of cycles | Thickness (nm) | Ra (nm) |
| --- | --- | --- | --- | --- | --- | --- |
| A | N | HfO2 | ALD | 100 | 9 | Islands |
| B | N | HfON | PEALD | 100 | 9 | 0.15-0.2 |
| C | Y | HfON | PEALD | 50 | 5.7 | 0.15 |
| D | Y | HfON | PEALD | 30 | 5.7 | 0.15 |
| E | Y | HfON | PEALD | 15 | 2.4 | 0.30 |
| F | Y | HfO2 | PEALD | 50 | 5.7 | 0.53 |
| G | Y | HfO2 | ALD | 30 | 4.5 | 0.44 |
| H | Y | Both | Both | 5 + 25 | 4.4 | 0.28 |
| I | Y | Both | Both | 10 + 20 | 4.3 | 0.22 |
| J | Y | HfO2 | ALD | 30 | — | 0.53 |

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a transistor, comprising:
   forming a semiconducting layer directly on a semiconducting substrate;
   applying a hexagonal boron nitride (hBN) monolayer directly upon the semiconducting layer;
   forming a gate dielectric layer upon the hBN monolayer, either by using a plasma-enhanced deposition process or by pretreating the hBN monolayer with plasma and then using a deposition process;
   forming a patterned photoresist layer upon the gate dielectric layer;
   etching through the gate dielectric layer, the hBN monolayer, and the semiconducting layer to form a first trench and a second trench; and
   forming a source terminal in the first trench and a drain terminal in the second trench which contact the semiconducting layer; and
   forming a gate terminal upon the gate dielectric layer, to obtain a side-contact transistor.

2. The method of claim 1, wherein the gate dielectric layer is formed using plasma-enhanced atomic layer deposition (PEALD) or plasma-enhanced chemical vapor deposition (PECVD).

3. The method of claim 1, wherein the hexagonal boron nitride (hBN) monolayer is grown on a separate surface, then removed from the separate surface and transferred to the semiconducting layer.

4. The method of claim 1, wherein the semiconducting layer comprises $MoS_2$, $MoSe_2$, $WS_2$, $WSe_2$, $SnS_2$, $ReS_2$, InSe, phosphorene, tellurene, or graphene.

5. The method of claim 1, wherein the gate dielectric layer comprises $HfO_2$, $ZrO_2$, $Al_2O_3$, hafnium oxynitride, or zirconium oxynitride.

6. The method of claim 1, wherein the gate terminal comprises TIN, Pt, Co, Rh, Pd, Ti, or Ta.

7. The method of claim 1, wherein the semiconducting layer has a thickness of about 0.4 nanometers to about 1.5 nanometers.

8. The method of claim 1, wherein the gate dielectric layer has a thickness of about 0.8 nanometers to about 50 nanometers.

9. The method of claim 1, wherein the gate terminal has a thickness of about 6 nanometers to about 50 nanometers.

10. The method of claim 1, wherein the semiconducting substrate comprises silicon, $Al_2O_3$, SiC, gallium arsenide (GaAs), indium arsenide (InAs), or indium phosphide (InP).

11. The transistor formed by the method of claim 1.

12. A method for making a transistor, comprising:
    forming a semiconducting layer directly on a semiconducting substrate;
    applying a hexagonal boron nitride (hBN) monolayer upon the semiconducting layer;
    forming a gate dielectric layer upon the hBN monolayer using a plasma-enhanced deposition process;
    forming a patterned photoresist layer upon the gate dielectric layer;
    etching through the gate dielectric layer, the hBN monolayer, and the semiconducting layer to form a first trench and a second trench; and forming a source terminal in the first trench and a drain terminal in the second trench which contact the semiconducting layer; and forming a gate terminal upon the gate dielectric layer, to obtain a side-contact transistor.

13. The method of claim 12, wherein the gate dielectric layer is formed using plasma-enhanced atomic layer deposition (PEALD) or plasma-enhanced chemical vapor deposition (PECVD).

14. The method of claim 12, wherein the hexagonal boron nitride (hBN) monolayer is grown on a separate surface, then removed from the separate surface and transferred to the semiconducting layer.

15. The method of claim 12, wherein the semiconducting layer comprises $MoS_2$, $MoSe_2$, $WS_2$, $WSe_2$, $SnS_2$, $ReS_2$, InSe, phosphorene, tellurene, or graphene.

16. The method of claim 12, wherein the gate dielectric layer comprises $HfO_2$, $ZrO_2$, $Al_2O_3$, hafnium oxynitride, or zirconium oxynitride.

17. A method for making a transistor, comprising:
forming a semiconducting layer directly on a semiconducting substrate;
applying a hexagonal boron nitride (hBN) monolayer upon the semiconducting layer;
forming a gate dielectric layer upon the hBN monolayer by pretreating the hBN monolayer with plasma and then using a deposition process;
forming a patterned photoresist layer upon the gate dielectric layer;
etching through the gate dielectric layer, the hBN monolayer, and the semiconducting layer to form a first trench and a second trench; and
forming a source terminal in the first trench and a drain terminal in the second trench which contact the semiconducting layer; and
forming a gate terminal upon the gate dielectric layer.

18. The method of claim 17, wherein the semiconducting layer comprises $MoS_2$, $MoSe_2$, $WS_2$, $WSe_2$, $SnS_2$, $ReS_2$, InSe, phosphorene, tellurene, or graphene.

19. The method of claim 17, wherein the gate terminal has a thickness of about 6 nanometers to about 50 nanometers.

20. The method of claim 17, wherein the semiconducting substrate comprises silicon, $Al_2O_3$, SiC, gallium arsenide (GaAs), indium arsenide (InAs), or indium phosphide (InP).

* * * * *